(12) United States Patent
Fan et al.

(10) Patent No.: US 11,616,501 B2
(45) Date of Patent: *Mar. 28, 2023

(54) PROGRAMMABLE FRACTIONAL TIME DELAY IN DIGITALLY OVERSAMPLED MICROPHONE SYSTEMS, CIRCUITS, AND METHODS

(71) Applicant: KOPIN CORPORATION, Westborough, MA (US)

(72) Inventors: Dashen Fan, Bellevue, WA (US); Joseph Yong Kwon, San Jose, CA (US)

(73) Assignee: SOLOS TECHNOLOGY LIMITED, Hong Kong (HK)

( * ) Notice: Subject to any disclaimer, the term of this patent is extended or adjusted under 35 U.S.C. 154(b) by 0 days.

This patent is subject to a terminal disclaimer.

(21) Appl. No.: 16/171,254

(22) Filed: Oct. 25, 2018

(65) Prior Publication Data

US 2019/0132682 A1 May 2, 2019

Related U.S. Application Data

(60) Provisional application No. 62/623,467, filed on Jan. 29, 2018, provisional application No. 62/578,425, filed on Oct. 28, 2017.

(51) Int. Cl.
*H03K 5/135* (2006.01)
*H03K 5/133* (2014.01)
(Continued)

(52) U.S. Cl.
CPC ............ *H03K 5/135* (2013.01); *H03K 5/133* (2013.01); *H04R 19/04* (2013.01);
(Continued)

(58) Field of Classification Search
CPC .................. H03K 5/135; H03K 5/133; H03K 2005/00019; H03K 2005/00234; H03K 2005/0026; H04R 3/002; H04R 19/04; H04R 1/005; H04R 3/00; H04R 3/005; H04R 2201/003; H04R 2499/11; H04R 2499/13; G10L 21/0232; H04H 60/04
(Continued)

(56) References Cited

U.S. PATENT DOCUMENTS 9,478,234 B1 * 10/2016 Nandy .................... G10L 15/30
2008/0195884 A1 * 8/2008 Subramanian ............ G06F 1/04
713/500
(Continued)

*Primary Examiner* — Paul Kim
(74) *Attorney, Agent, or Firm* — Peloquin, PLLC; Mark S. Peloquin, Esq.

(57) ABSTRACT

Programming time delay data in an oversampled sensor includes determining whether to enter Programming Mode based on a value of a system parameter received by the oversampled sensor. Programming Mode is entered when the value of the system parameter corresponds to Programming Mode. The time delay data is programmed in the oversampled sensor during Programming Mode. The oversampled sensor uses the time delay data to time delay its output in an oversampled domain. Programming Mode is exited after a predetermined time has expired relative to when Programming Mode was entered. The system parameter can be a frequency of a sampling clock signal.

31 Claims, 30 Drawing Sheets

(51) Int. Cl.
 H04R 19/04 (2006.01)
 H03K 5/00 (2006.01)
 H04R 3/00 (2006.01)
 H04R 1/00 (2006.01)

(52) U.S. Cl.
 CPC ............ *H03K 2005/00019* (2013.01); *H03K 2005/0026* (2013.01); *H03K 2005/00234* (2013.01); *H04R 1/005* (2013.01); *H04R 3/00* (2013.01); *H04R 3/005* (2013.01); *H04R 2201/003* (2013.01); *H04R 2499/11* (2013.01); *H04R 2499/13* (2013.01)

(58) Field of Classification Search
 USPC .... 381/113, 107, 7, 314, 111; 327/276, 158, 327/161, 277, 278; 375/355, 360, 326, 375/354, 371; 700/18, 94; 708/320, 300, 708/319, 3, 313; 365/189.2; 341/101, 341/143; 713/500
 See application file for complete search history.

(56) References Cited

U.S. PATENT DOCUMENTS

| | | | |
|---|---|---|---|
| 2008/0224750 A1* | 9/2008 | Reddy | H03H 17/0027 327/276 |
| 2017/0142519 A1* | 5/2017 | Lasseuguette | G10L 19/22 |
| 2017/0230750 A1* | 8/2017 | Pawlowski | H04R 19/04 |

* cited by examiner

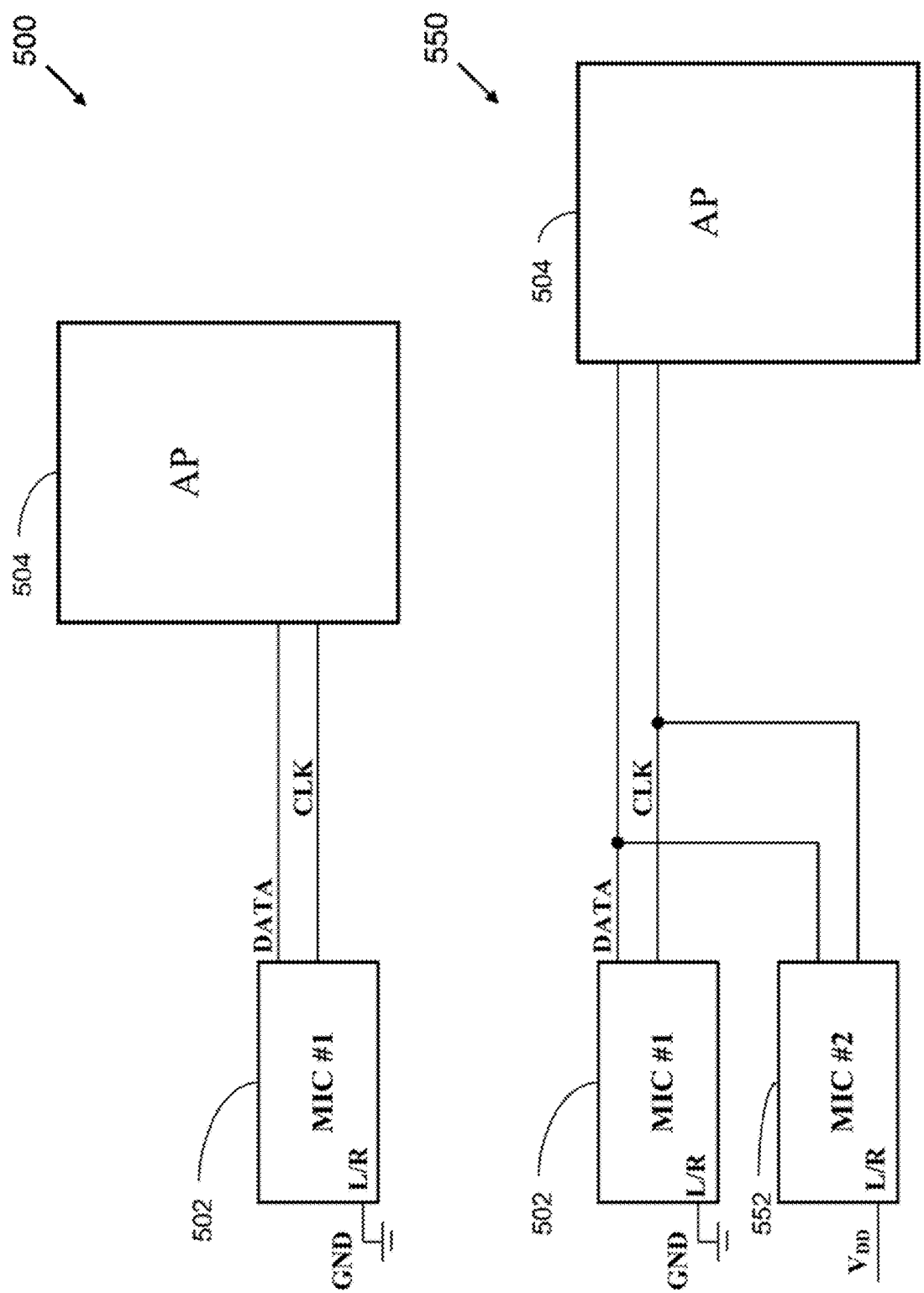

FIGURE 12A

| 1204<br>PDM Clock Freq ($f_{PDM}$) | 1206<br>Decimation Ratio | 1208<br>Baseband Sampling Rate ($f_s$) | 1210<br>Audio Signal Bandwidth ($f_s/2$) | 1202<br>Application |
|---|---|---|---|---|
| 4.8 MHz | 25x | 192 kHz | 96 kHz | Ultrasound |
| 4.8 MHz | 50x | 96 kHz | 48 kHz | Full-bandwidth audio |
| 3.072 MHz | 64x | 48 kHz | 24 kHz | |
| 2.4 MHz | 50x | 48 kHz | 24 kHz | Wide-bandwidth audio |
| 1.536 MHz | 48x | 32 kHz | 16 kHz | |
| 1.024 MHz | 64x | 16 kHz | 8 kHz | High-quality voice |
| 768 kHz | 48x | 16 kHz | 8 kHz | |
| 512 kHz | 32x | 16 kHz | 8 kHz | |
| 512 kHz | 64x | 8 kHz | 4 kHz | Standard voice |

FIGURE 13A

```
---------------begin code------------ timescale 1ns/10ps module fifo_512_1 (
    clk,
    reset_n,
    bypass,
    flush,
    delay_cnt,
    data_in,
    data_in_val,
    data_out,
    data_out_val
);

//////////////////////////////////////////
//
// I/O Declaration
//
//////////////////////////////////////////
input           clk;
input           reset_n;

input           bypass;
input           flush;
input   [9:0]   delay_cnt;
input           data_in;
input           data_in_val;
output          data_out;
output          data_out_val;

//////////////////////////////////////////
//
// Signal Declarations
//
//////////////////////////////////////////
```

FIGURE 13B

```verilog
//
reg   [6:0]  data_in_val_reg;
reg   [8:0]  wr_pointer;
reg   [8:0]  rd_pointer;
reg          data_out_val;
reg          data_out;
reg   [9:0]  used_cnt;
reg          wr_access;
wire         full;
wire         empty;
wire         rd_allow;
wire  [8:0]  ram_addr;
wire         wr_en;
wire         ram_wdata;
wire         ram_rdata;

wire [9:0] delay_cnt_qual = (delay_cnt >= 10'd511) ? 10'd511 : delay_cnt;

always @(posedge clk or negedge reset_n)
begin : DELAYFFS
  if (!reset_n) begin
    data_in_val_reg <= 7'd0;
    wr_pointer      <= 9'd0;
    rd_pointer      <= 9'd0;
    data_out_val    <= 1'b0;
    data_out        <= 1'd0;
    used_cnt        <= 1'd0;
    wr_access       <= 1'b0;
  end
  else begin
    //
    data_in_val_reg <= {data_in_val_reg[2], (data_in_val && (~bypass) && (~flush))};
    //
    if (flush) begin
      wr_pointer    <= 9'd0;
    end
    else if (data_in_val_reg[2] && (!full)) begin
      wr_pointer    <= wr_pointer + 9'd1;
    end
    //
```

FIGURE 13C

```
if (flush) begin
  rd_pointer   <= 9'd0;
end
else if (!bypass || delay_cnt_qual[9:0] == 10'd0) && (used_cnt >= delay_cnt_qual[9:0] && data_in_val_reg[0] && (!empty)) begin
  rd_pointer <= rd_pointer + 9'd1;
end
//
if (bypass || delay_cnt_qual[9:0] == 10'd0) begin
  data_out_val <= data_in_val;
end
else if (rd_allow) begin
  data_out_val <= data_in_val_reg[0];
end
else begin
  data_out_val <= 1'b0;
end
//
if (bypass || delay_cnt_qual[9:0] == 10'd0) begin
  data_out   <= data_in;
end
else if (rd_allow) begin
  data_out   <= ram_rdata;
end
//
if (flush) begin
  used_cnt <= 10'd0;
end
else if (data_in_val_reg[2] && (!full)) begin
  used_cnt <= used_cnt + 10'd1;
end
else if (!bypass || delay_cnt_qual[9:0] == 10'd0) && (used_cnt >= delay_cnt_qual[9:0] && data_in_val_reg[0] && (!empty)) begin
  used_cnt <= used_cnt - 10'd1;
end
//
if (data_in_val) begin
  wr_access  <= 1'b1;
end
else if (data_in_val_reg[2]) begin
  wr_access  <= 1'b0;
end
end
```

FIGURE 13D

```
end assign full    = (used_cnt == 10'd512);
assign empty   = (used_cnt == 10'd0);
assign rd_allow = (bypass || delay_cnt_qual[9:0] == 10'd0) ? 1'b0 : (used_cnt >= delay_cnt_qual[9:0]);

assign ram_addr = wr_access ? wr_pointer : rd_pointer;
assign ram_wdata = data_in;
assign wr_en    = data_in_val_reg[0] && (!full);

reg ram_ce;
always @(posedge clk or negedge reset_n)
begin : RAMCE
    if (!reset_n) begin
        ram_ce <= 1'b1;
    end
    else begin
        //
        if (data_in_val) begin
            ram_ce <= 1'b1;
        end
        else if (data_in_val_reg[4]) begin
            ram_ce <= 1'b0;
        end
    end
end
wire    #1 ram_cen = ram_ce;
wire    #1 ram_wen = !wr_en;
wire [8:0] #1 ram_a = ram_addr;
wire    #1 ram_d = ram_wdata;
SPRAM512X1 sram_512_1 (
    .Q   (ram_rdata),
    .CLK (clk),
    .CEN (ram_cen),
    .WEN (ram_wen),
    .A   (ram_a),
    .D   (ram_d)
);

endmodule
---------- end code ----------
```

PROGRAMMABLE FRACTIONAL TIME DELAY IN DIGITALLY OVERSAMPLED MICROPHONE SYSTEMS, CIRCUITS, AND METHODS

RELATED APPLICATIONS

This patent application claims priority from U.S. Provisional Patent Application titled "FRACTIONAL TIME DELAY IN DIGITALLY OVERSAMPLED MICROPHONE SYSTEMS, CIRCUITS, AND METHODS," filed on Oct. 28,2017, Ser. No. 62/578,425. This patent application claims priority from U.S. Provisional Patent Application titled "FRACTIONAL TIME DELAY IN DIGITALLY OVERSAMPLED MICROPHONE SYSTEMS, CIRCUITS, AND METHODS," filed on Jan. 29, 2018, Ser. No. 62/623,467.

U.S. Provisional Patent Application titled "FRACTIONAL TIME DELAY IN DIGITALLY OVERSAMPLED MICROPHONE SYSTEMS, CIRCUITS, AND METHODS," filed on Oct. 28,2017, Ser. No. 62/578,425 is hereby incorporated by reference. U.S. Provisional Patent Application titled "FRACTIONAL TIME DELAY IN DIGITALLY OVERSAMPLED MICROPHONE SYSTEMS, CIRCUITS, AND METHODS," filed on Jan. 29, 2018, Ser. No. 62/623,467 is hereby incorporated, by reference. Commonly owned U.S. Non-provisional patent application Ser. No. 15/225,745, titled "Time Delay In Digitally Oversampled Sensor Systems, Apparatuses, and Methods," is hereby incorporated by reference.

This patent application is being co-filed on the same day, Oct. 25, 2018 with "FRACTIONAL TIME DELAY STRUCTURES IN DIGITALLY OVERSAMPLED MICROPHONE SYSTEMS, CIRCUITS, AND METHODS," by Dashen Fan and Joseph Yong Kwon.

BACKGROUND OF THE INVENTION

1. Field of Invention

The invention relates generally to sampled systems more specifically to time delay in digitally oversampled microphone sensor systems, circuits, and methods.

2. Art Background

Field quantities which exist in the natural world are generally analog signals which have continuously varying amplitude as a function of time. Examples of these field quantities are sound pressure, vibration, light, etc. Measurement of a field quantity is accomplished with an analog sensor or a digital sensor. Digital electronics work with digital signals. Interfacing analog signals with digital electronics presents a technical problem for which a technical solution using a technical means is needed.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

FIG. 5 illustrates a one or two microphone system providing a programmable fractional time delay with an existing system bus and Application Processor, according to embodiments of the invention.

FIG. 12A illustrates various applications and the corresponding sampling data.

FIG. 13A-13E illustrates Verilog HDL code for implementing the 512×1 SRAM delay circuit shown in FIGS. 18A-18G, according to embodiments of the invention.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

Systems and methods are described for applying a fractional time delay to an oversampled digital signal. In various embodiments the time delay is applied in various locations within the oversampled domain of the digital signal during signal processing in an analog-to-digital converter (ADC). Examples are provided in the context of application to digital microphones. The examples are applicable to various digital microphones utilizing Pulse Density Modulated (PDM) signals. A digital microphone can be made as a Micro-Electrical Mechanical System (MEMS) device. Embodiments of the invention can be applied to an existing MEMS PDM microphone or a custom MEMS PDM microphone can be configured with various embodiments of the invention. In the discussion that follows, application of embodiments of the invention to a commercially available digital microphone is described. One commercially available microphone is the KNOWLES® model SPK0415HM4H-B. The descriptions of embodiments applied to the KNOWLES® microphone are readily applicable to a custom MEMS microphone, no limitation is implied by the use of the KNOWLES® microphone.

Figure 1:
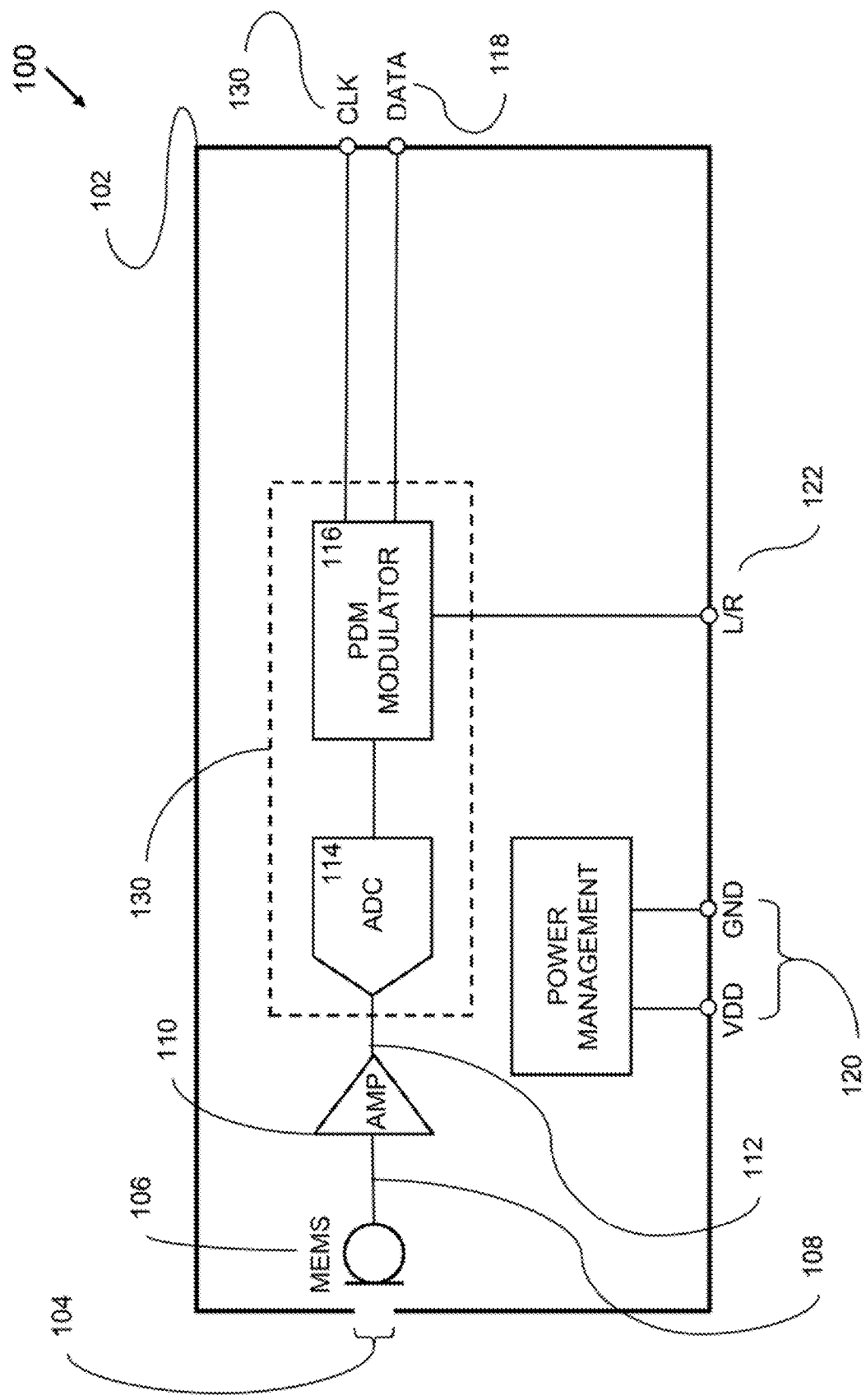
FIG. 1 illustrates an existing digital microphone.

FIG. 1 illustrates an existing digital microphone that does not have the functionality necessary to introduce a fractional time delay in the oversampled domain. With reference to FIG. 1, a MEMS PDM microphone 100 is illustrated in high level block diagram form. In this example, given only for illustration, with no limitation implied thereby, the microphone is a KNOWLES® model SPK0415HM4H-B. The MEMS PDM microphone is provided in a housing 102 with an acoustic port 104. A MEMS transducer 106 receives acoustic signals through the acoustic port and outputs an analog signal 108 into an amplifier 110. The amplifier output 112 is digitized and oversampled using the analog-to-digital converter (ADC) 114 and Pulse Density Modulation (PDM) modulator 116 to produce an oversampled output at the data terminal 118 of the microphone 100. In some microphone configurations a sigma-delta modulator alternatively referred to as a delta-sigma modulator ($\Sigma\Delta$ or $\Delta\Sigma$) 130 is used to provide the digital oversampled signal without any limitation implied thereby. A clock signal (CLK), indicated at 130, is provided to the PDM modulator. The microphone system is provided with a source of electrical power 120 as illustrated with supply voltage $V_{DD}$. The L/R bit permits two microphones to be addressed. If the microphone's L/R pin 122 is tied to GND, this microphone drives the DATA only during falling CLK edge. If the microphone's L/R pin 122 is tied to VDD, this microphone drives the DATA during rising CLK edge. Therefore, with the system shown in FIG. 1, two microphones can be driven by the same clock and the L/R bit is used to distinguish data out from each of the microphones. For this example, using the KNOWLES® device, the clock can be operating in the range of 1 to 3.25 MHz.

Figure 2:
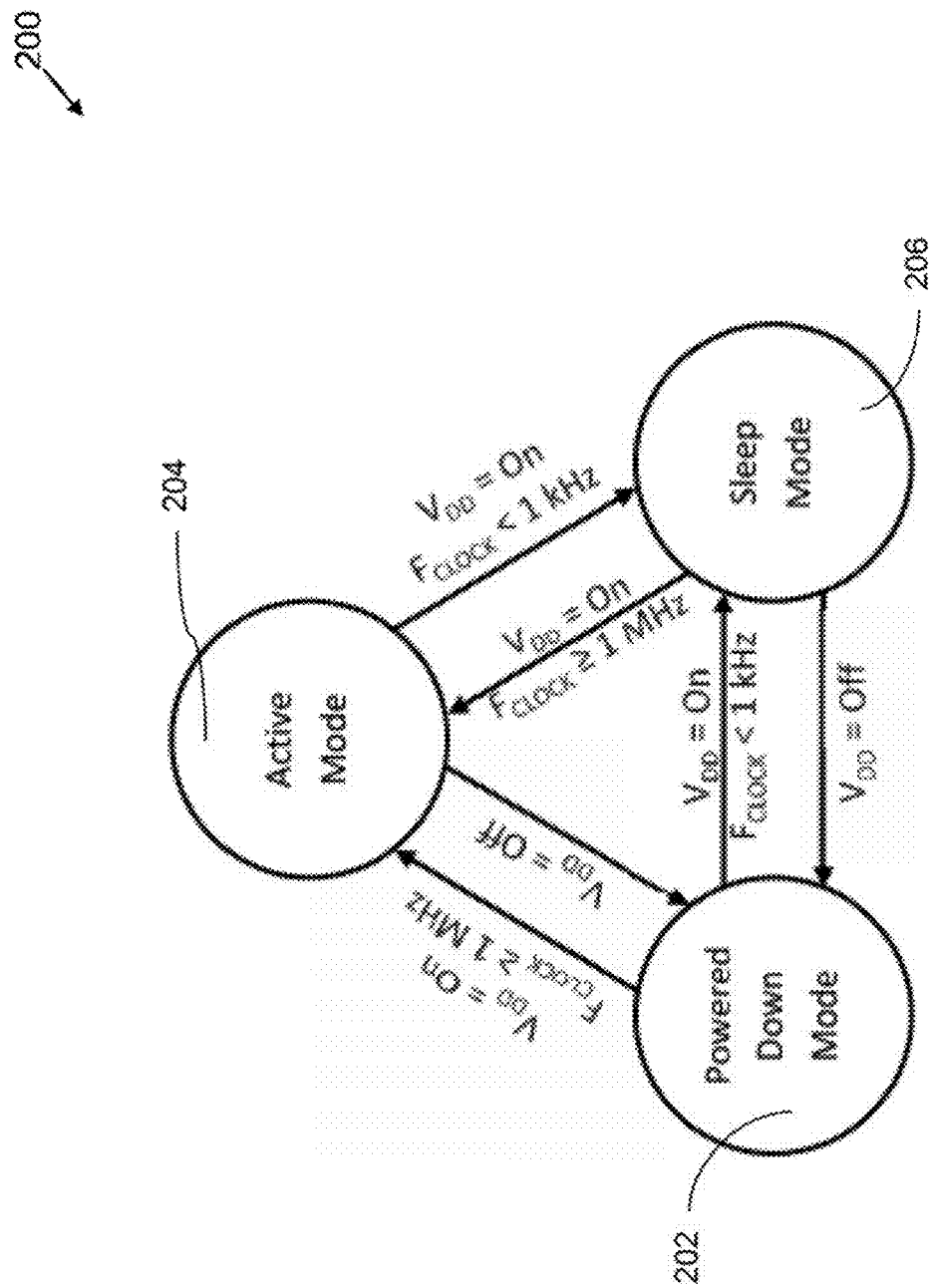
FIG. 2 illustrates a state diagram corresponding to the existing digital microphone of FIG. 1.

FIG. 2 illustrates, generally at 200, a state diagram corresponding to the existing digital microphone of FIG. 1. With reference to FIG. 2, the microphone system can exist in one of three states, i.e., Power Down Mode 202, Active Mode 204, or Sleep Mode 206. $V_{DD}$=OFF places the system in Power Down Mode 202. With $V_{DD}$=ON and the clock frequency less than 1 kHz the system transitions into Sleep Mode 206 from Power Down Mode 202. With $V_{DD}$=ON and the clock frequency ≥1 MHz the system transitions from Power Down Mode 202 to Active Mode 204. From Active Mode 204, the system can be powered down if $V_{DD}$=OFF (0) or transitioned to Sleep Mode 206 if the clock frequency falls below 1 kHz. The microphone is typically controlled by an external processor referred to in the art in various ways, such as, the Application Processor (AP), processor module, programmer chip, etc. As used in this description of embodiments, Application Processor (AP) is used to refer to the processor that is external from the microphone with no limitation implied by use of the term AP or AP Processor. The AP typically provides the clock signal that is used by the microphone to change the state of the system and the AP can provide the decimating, filtering, and Pulse Code Modulation (PCM) processing needed to output baseband audio signals representative of the microphone input. Thus, the MEMS PDM microphone responds to the clock signal received from the AP and transitions to the appropriate state.

Figure 3:
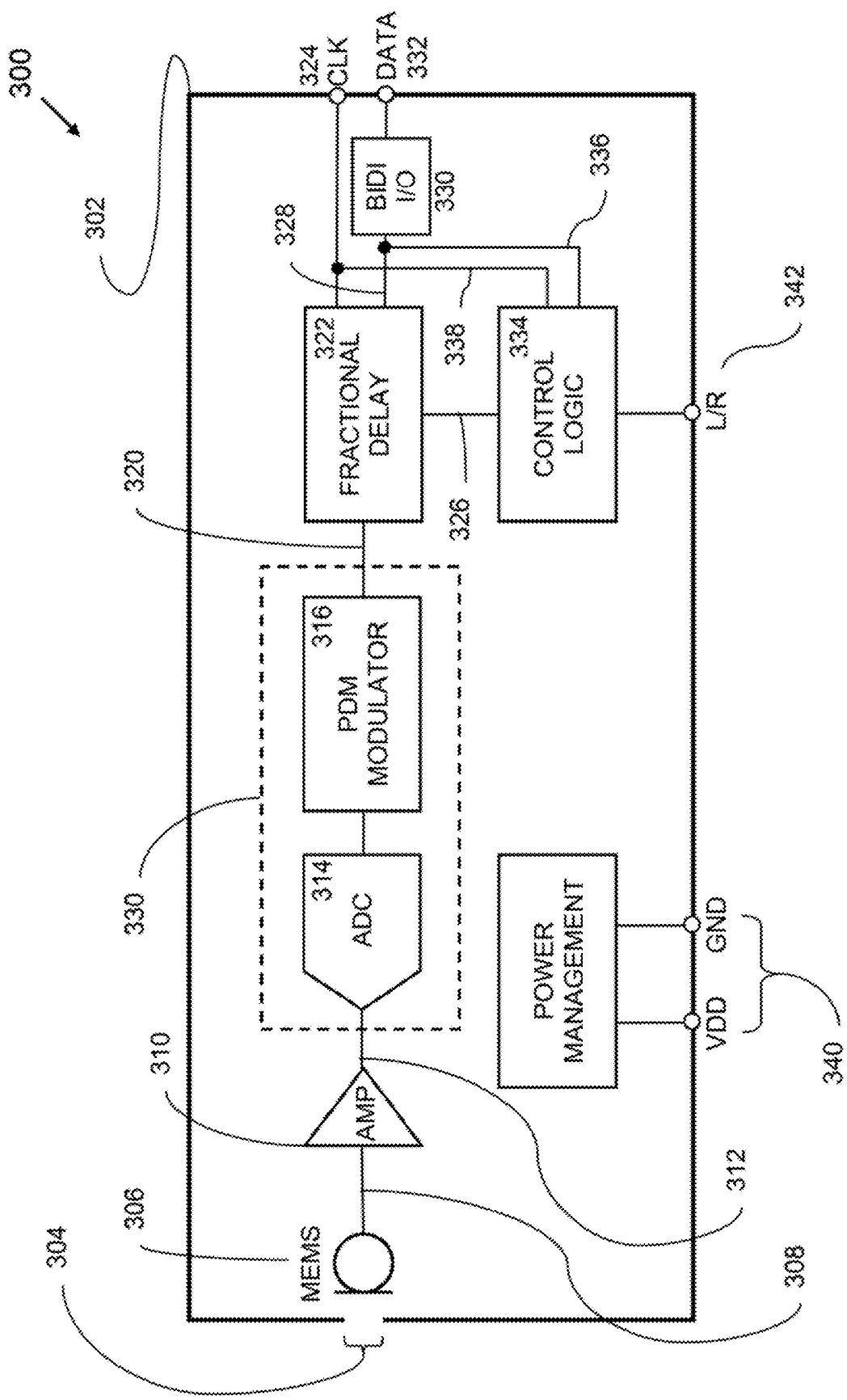
FIG. 3 illustrates a microphone system providing a programmable fractional time delay applied to the digital microphone of FIG. 1, according to embodiments of the invention.

FIG. 3 illustrates, generally at 300, a microphone system providing a programmable fractional time delay applied to the digital microphone of FIG. 1, according to embodiments of the invention. With reference to FIG. 3, a MEMS PDM microphone 300 is illustrated in high level block diagram form. In this example, given only for illustration, with no limitation implied thereby, the microphone is a modified KNOWLES® model SPK0415HM4H-B. The MEMS PDM microphone 300 is provided in a housing 302 with an acoustic port 304. A MEMS transducer 306 receives acoustic signals through the acoustic port 304 and outputs an analog signal 308 into an amplifier 310. The amplifier output 312 is digitized and oversampled using the analog-to-digital converter (ADC) 314 and Pulse Density Modulation (PDM) modulator 316 to produce an oversampled output at 320. In some microphone configurations a sigma-delta modulator alternatively referred to as a delta-sigma modulator ($\Sigma\Delta$ or $\Delta\Sigma$) 330 is used to provide the digital oversampled signal without any limitation implied thereby. A clock signal (CLK), indicated at 324, is provided to the PDM modulator 316 (trace not shown to avoid undue complexity in the illustration). The microphone system 300 is provided with a source of electrical power 340 as illustrated with supply voltage $V_{DD}$. The L/R bit permits two microphones to be addressed. If the microphone's L/R pin 342 is tied to GND, this microphone drives the DATA only during falling CLK edge. If the microphone's L/R pin 342 is tied to VDD, this microphone drives the DATA during rising CLK edge. Therefore, with the system shown in FIG. 3, two microphones can be driven by the same clock and the L/R bit is used to distinguish data out from each of the microphones. For this example, using the modified KNOWLES® device, the clock can be operating in the range of 1 to 3.25 MHz.

To accomplish creating a fractional time delay in the microphone output signal, the oversampled output 320 is input into a Fractional Delay Block 322. The input to the Fractional Delay Block 322 is coupled to the output 320 of the PDM modulator 316. The Fractional Delay Block 322 receives the clock signal (CLK) 324. The Fractional Delay Block 322 is coupled via 326 to control logic at 334 and is coupled via 328 to the bidirectional input/output (BIDI I/O 330. The control logic 334 is coupled at 336 to BIDI I/O 330, the CLK line 324, the L/R pin 342, and to the Fractional Delay Block 322. In operation, the Fractional Delay Block 322 receives as an input the output 320 from the PDM modulator 316 and introduces a time delay thereby outputting at 328 and onto the DATA line at 332 a time delayed version of its input 320 where the time delay applied is a fraction of a baseband clock period. Fractional time delay in the oversampled domain is described more fully in U.S. Ser. No.: 15/225,745. As used in this description of embodiments, the terms "fractional time delay" or "fractional delay" can be greater than a period of a baseband clock cycle. For example, the fractional time delay applied at 322 can include one or more integer periods of a baseband clock cycle plus a fraction thereof. Note that the fractional time delay is still applied in the oversampled domain not in the baseband domain.

The magnitude of the time delay applied by the Fractional Delay Block 322 is programmable and can be selected from a range of values based on the ratio of the sampling clock frequency to the baseband clock frequency and the period of the sampling clock. In one example, a Fractional Delay Block 322 can be programmed to apply a number of time delay elements, where the number ranges from 0 to 512 delay elements, where a delay element provides a time delay that is equal to a sampling clock period.

Programming

Programming the Fractional Delay Block 322 is accomplished by utilizing the bi-directional input/output (BIDI I/O) 330 on the DATA line 332. A Control Logic Block 334 monitors at 338 the sampling clock signal 324 and the control logic block 334 is also connected at 336 to the DATA line 332 to receive the programming data. The control logic block 334 is also connected at 326 to the Fractional Delay Block 322 to communicate the information needed to program the magnitude of the time delay.

Embodiments of the invention provide a programmable fractional delay to the output of a MEMS PDM microphone. Thus, the system illustrated in FIG. 3 can be used in each of two microphones that are driven with the same clock and that have data output on a shared data line (indicated by the DATA pin 332 in FIG. 3) where the data for each microphone is identified using the characteristics of the L/R bit. Thus, two microphone beamforming can be accomplished with embodiments of the invention incorporated into the MEMS PDM microphones.

In some cases, when embodiments of the invention are applied to existing MEMS PDM microphone systems it is desirable to do so without disturbing the circuitry or footprint of the existing microphone system. It is also desirable to provide the microphone functionality with minimum impact on the AP processor. In the case of the KNOWLES® MEMS PDM microphone, a new system state (Programming Mode) is created in which the programming is accomplished. Programming Mode is illustrated in the state diagram shown in FIG. 4A below.

In various embodiments, the AP and the Control Logic Block utilize a system parameter to establish Programming Mode. In some embodiments, the system parameter is a frequency of the clock signal (CLK) provided by AP processor. An intermediate clock frequency is used to bring the system into Programming Mode. In various non-limiting examples, provided only for illustration, the intermediate clock frequency is selected from the range of greater than 1 kHz to less than 1 MHz, with the consideration being that programming needs to be accomplished when the DATA line is in input mode and the microphones are not outputting data. As one example, with no limitation implied thereby, for the two microphone system and an 8 bit address, 100 kHz is selected as the clock frequency used during Programming Mode. Other intermediate clock frequencies can be used to enter Programming Mode along with an appropriate choice of system timer value in order to avoid contention on the output DATA line (bus), thus 100 kHz is used merely as an example and is not limiting.

Note that in the Default Configuration, without programming via the CLK and DATA lines and the AP's GPIO pins, the modified MEMS PDM microphone e.g., 300 in FIG. 3, will function like a typical MEMS PDM microphone, e.g., 100 in FIG. 1.

Figure 4A:
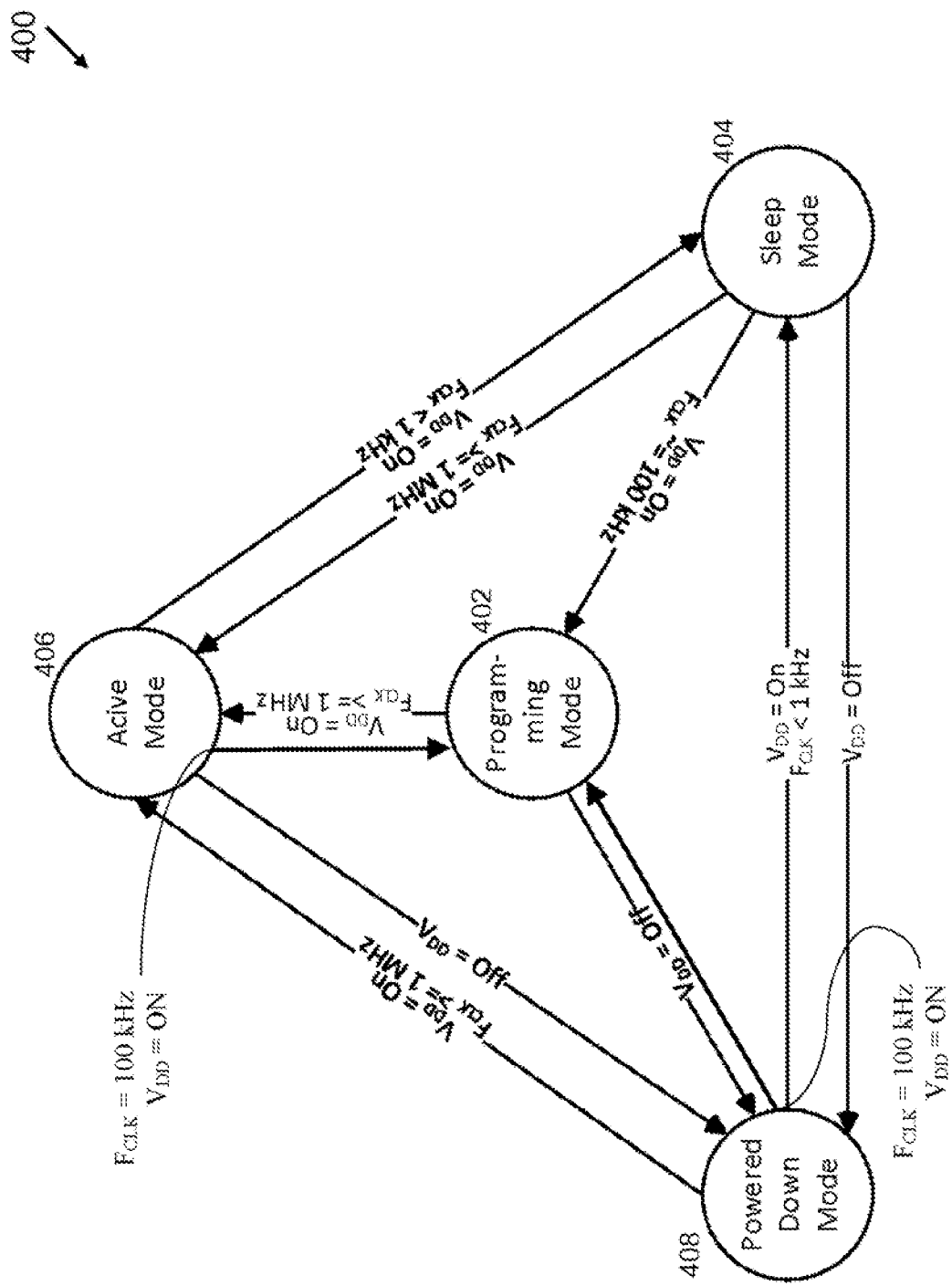
FIG. 4A illustrates a state diagram corresponding to the microphone system of FIG. 3.

FIG. 4A illustrates, generally at 400, a state diagram corresponding to the microphone system of FIG. 3. With reference to FIG. 4A, Programming Mode 402 can be entered via different routes, if desired, for a given system design. In a first route, if the system is in Sleep Mode 404, Programming Mode 402 can be entered by raising the frequency of the sampling clock to the trigger frequency, also referred to herein as the intermediate frequency, (100 kHz in this example). In a second route (optional), if the system is in Active Mode 406, Programming Mode 402 can be entered by reducing the frequency of the sampling clock to the intermediate frequency (100 kHz in this example). To facilitate the functionality of the second route, the Control Logic will need to monitor the CLK frequency in Active Mode 406 in order to transition the system to Programming Mode 402 when the CLK frequency changes to the intermediate frequency. Both routes can bring the system to Programming Mode 402 and allow the delay value in the Fractional Delay Block (e.g. 322 in FIG. 3) to be programmed. In a third route, the system design illustrated with the state diagram of FIG. 4A, permits Programming Mode 402 to be entered from Power Down Mode 408 when $V_{DD}$=ON and the frequency of the sampling clock is increased to 100 kHz. From Power Down Mode 408 the system can also be transitioned to Active Mode 406, in which case the Control Logic can be powered down to save power (monitoring CLK frequency is still required in Active Mode 406 to facilitate the second route into Programming Mode 402 if implemented in a given system design). Alternatively, from Powered Down Mode 408, the system can be transitioned to Sleep Mode 408 with $V_{DD}$=ON and the frequency of the sampling clock less than 1 kHz.

In one embodiment, programming a microphone is accomplished in the following order and the programming method can be applied to two microphones (if a second microphone is used); the microphone(s) are programmed sequentially in the following order:

Note 1: With $V_{DD}$=ON and the clock below 1 KHz, the microphone is in Sleep Mode 404. The control logic circuitry stays active in Sleep Mode 404. The signal on the DATA pin 332 is changed to input mode.

Note 2: When the clock frequency is elevated to the intermediate frequency (in this case 100 kHz), the programming starts with the following sequence in the DATA line with the most significant bit (MSB) sent first:

Step 1. "Magic Word" is a unique word used to mark the beginning of a frame of programming data. Only the microphones that have embodiments of the invention incorporate therein recognize this word. An example of a Magic Word is "0x46."

Step 2. Microphone address. The least significant bit (LSB) is the value of the L/R pin, which is associated with a given microphone. The control logic in a given microphone uses the value of the LSB to compare with its L/R pin value (1 or 0) thereby allowing two microphones to be individually addressed from the shared DATA line, where microphone #1 has been assigned L/R=0 and microphone #2 has been assigned L/R=1 (or vise versa). For a system design using an address one byte long, the bits are assigned as follows: bits 7-4 (Magic Word Extension, for example "0xE"), bit 3: 0, bit 2: 0, bit 1: 0, bit 0: L/R pin state.

Step 3. Delay Value (2 bytes). This is either the magnitude of the time delay value or meta data related to the magnitude of the time delay value that is being programmed into the fractional delay block. For example, a magnitude of a delay value is bounded by the period of the sampling clock at one end of the range and the period of the baseband clock (decimated final audio sampling rate) at the other end of the range. Note that the delay value is flexible can in various embodiments, it can be a sum of a number of sampling clock periods and one or more baseband clock periods. Meta data can include but is not limited to a number of sampling clock cycles associated with the programmable time delay, etc. This Delay Value is provided by the user in support of the particular application that the microphone system is used in.

Step 4. If either the Magic Word and/or Address is incorrect, then the system is transitioned out of Programming Mode 402 and back into the Default Configuration.

Step 5. The control logic within the microphone sends back an Acknowledge Byte (Ack Byte) on the DATA line in response to receiving the correct sequence. The Ack Byte provides an acknowledgment back to the AP that the correct sequence has been received. A non-limiting example of the Acknowledge Byte is "0xA6."

Step 6. Once programming of Microphone #1 has been completed the Control Logic starts a timer. The length of the timer is set to a value greater than the time needed to program all of the microphones in the system. If the timer value is too short than the microphone data will get on the bus during programming mode. This occurrence is to be avoided by proper selection of a value "$t_m$" for the timer. As a general relationship, if the duration of time needed to program one microphone is "t" and the number of microphones is "n" then n×t<$t_m$. For example, at 100 kHz it takes approximately 0.4 milliseconds (ms) to program one microphone. Eight microphones would make n=8 for a total programming time of 8×0.4 ms=3.2 ms to program eight microphones. In this case, the timer value could be set to 5 ms, which is greater than 3.2 ms, thereby eliminating contention on the DATA line. Thus, the timer is set to a time that is greater than the time needed to accomplish programming all of the microphones that are used in the eight microphone system of this example. 3.2 ms programming time and timer value of 5 ms are given as one example, no limitation is implied thereby. If the intermediate frequency is greater than 100 kHz the programming time decreases, and the timer value can be adjusted accordingly. In addition, those of ordinary skill in the art will recognize that any value that is greater than then the total programming time can be selected for the timer value.

Step 7. Steps 1 through 5 above are repeated to accomplish programming the second microphone at a different address.

Step 8. After the time established by the timer value expires, the AP no longer uses the CLK and DATA lines for programming, the AP changes to operational clock (1 MHz in the example) and receives data on the DATA line.

Note 3. The value programmed into the delay register is not persistent. If $V_{DD}$ is not ON then the delay register value reverts back to the default state value and the system transitions to Powered Down Mode 408 (in one or more embodiments).

Note 4. The delay register value can be reprogrammed when in normal operational mode (such as Active Mode 406) after the initial programming by the following steps:
1. Apply a clock signal at a frequency below 1 kHz with $V_{DD}$=ON. ON.
2. Microphone transitions to Sleep Mode 404 (in one or more embodiments or the Microphone can transition from Power Down Mode 408 to Programming Mode 402 depending on a system design), control logic transitions to the default state values. The signal on the DATA line changes to INPUT mode.
3. AP provides the intermediate clock frequency (100 kHz in the example above) the control logic responds to intermediate clock frequency and the delay element of the fractional delay block is reprogrammed.

Figure 4B:
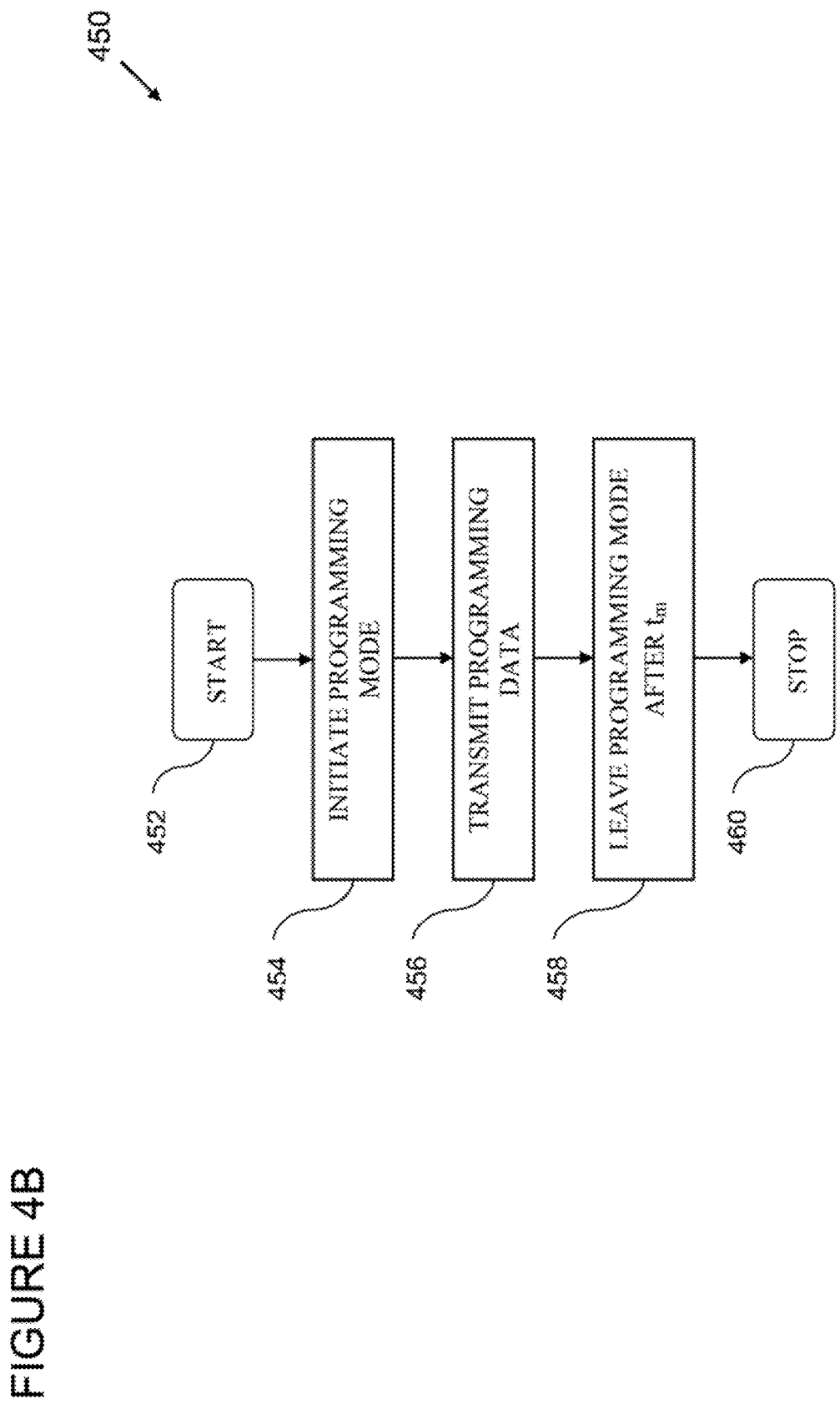
FIG. 4B illustrates a process for programing a fractional time delay.

FIG. 4B illustrates, generally at 450, a process for programing a fractional time delay. With reference to FIG. 4A and FIG. 4B a process starts at a block 452. At a block 454 Programming Mode is initiated. In one or more embodiments, initiating Programming Mode is accomplished through paths described above in conjunction with FIG. 4A utilizing an intermediate clock frequency when VDD is ON.

At a block 456 programming data is transmitted. Programming data has been described above to be the fractional time delay value or meta data related to the fractional time delay value that will be used by the microphone. The system stays in Programming Mode long enough to accomplish programming the number of microphones used in a given system to prevent contention on the bus. Embodiments of the invention have been described above to accommodate programming a general number of microphones.

At a block 458, control transitions away from Programming Mode. Depending on whether VDD is ON or OFF and whether the clock frequency is at the intermediate value or the operational value, control will transfer to either Power Down Mode 408 or Active Mode 406.

At a block 460 the process stops.

FIG. 5 illustrates a one or two microphone system providing a programmable fractional time delay with no impact on an existing system bus, according to embodiments of the invention. With respect to FIG. 5, at 500, Microphone #1 502 has been modified according to embodiments of the invention to permit application of a fractional time delay to the microphone output in the oversampled domain. The fractional time delay can be programmed through the use of the AP processor 504 as described herein. Up to two microphones can be used with the AP processor 504 to provide programmable fractional time delays to each of Microphone #1 502 and Microphone #2 552 as shown in FIG. 5 at 550 while utilizing the existing system bus connections with CLK (sampling clock), and DATA lines. Thus, through application of embodiments of the invention, programmable fractional time delay functionality is incorporated into existing MEMS PDM microphones with no impact on the microphone's connection to the AP processor.

Figure 6:
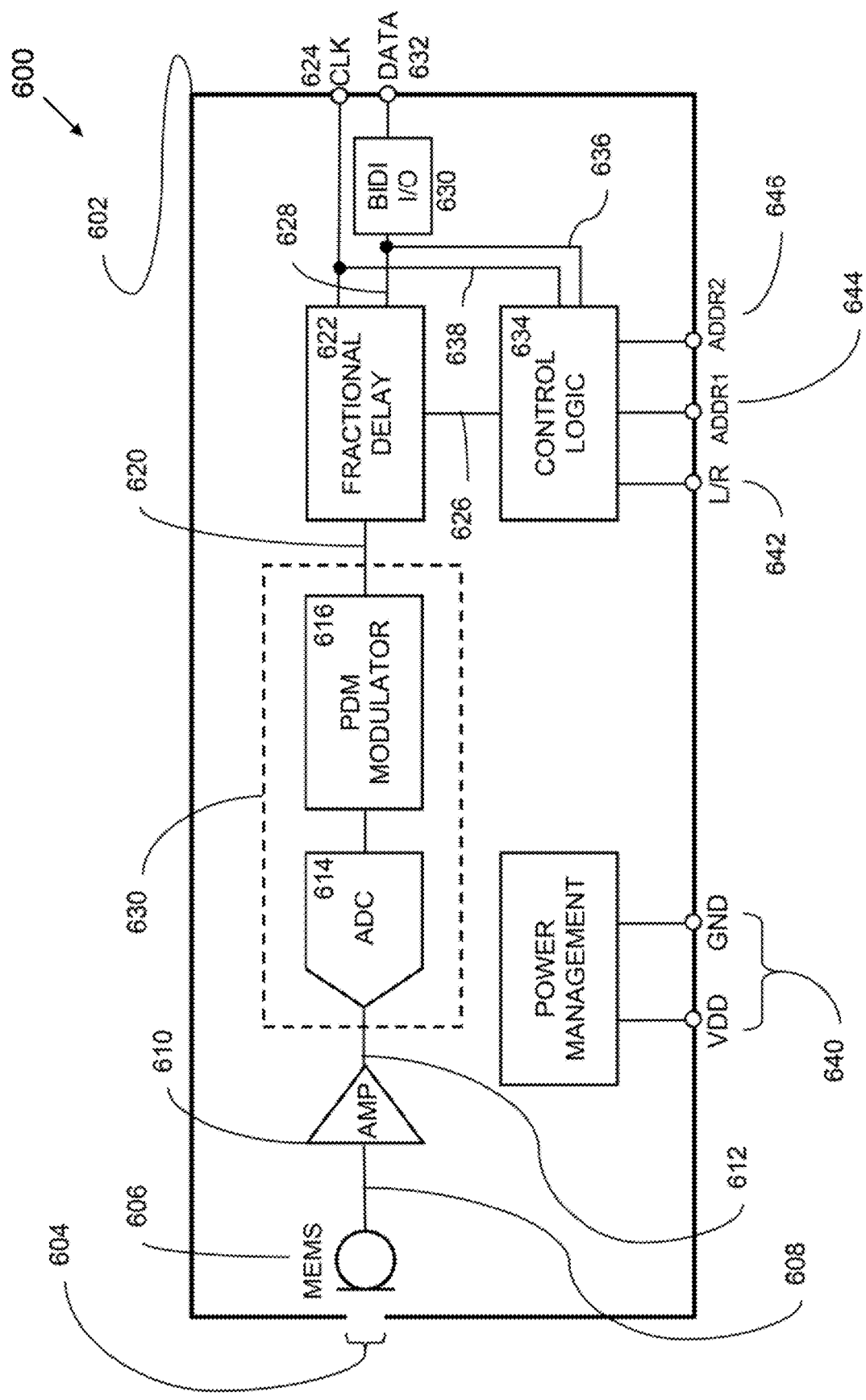
FIG. 6 illustrates a microphone system providing a programmable fractional delay with system expansion for more than two microphones, according to embodiments of the invention.

FIG. 6 illustrates, generally at 600, a microphone system providing a programmable fractional delay with system expansion for more than two microphones, according to embodiments of the invention. With reference to FIG. 6, the microphone system 600 is expanded to accommodate more than two microphones through the addition of one or more addressing lines. In the example provided herein, two addressing lines are described, i.e., ADDR1 indicated at 644 and ADDR2 indicated at 646. Two addressing lines are not limiting, the system can be configured with more than two addressing lines to provide as many microphones as required for a given embodiment.

A modified MEMS PDM microphone 600 is illustrated in high level block diagram form. In this example, given only for illustration, with no limitation implied thereby, the microphone is a modified KNOWLES® model SPK0415HM4H-B. The MEMS PDM microphone 600 is provided in a housing 602 with an acoustic port 604. A MEMS transducer 606 receives acoustic signals through the acoustic port 604 and outputs an analog signal 608 into an amplifier 610. The amplifier output 612 is digitized and oversampled using the analog-to-digital converter (ADC) 614 and Pulse Density Modulation (PDM) modulator 616 to produce an oversampled output at 620. In some microphone configurations a sigma-delta modulator alternatively referred to as a delta-sigma modulator (ΣΔ or ΔΣ) 630 is used to provide the digital oversampled signal without any limitation implied thereby. A clock signal (CLK), indicated at 624, is provided to the PDM modulator 630 (trace not shown to avoid undue complexity in the illustration). The microphone system 600 is provided with a source of electrical power 640 as illustrated with supply voltage $V_{DD}$. The L/R bit permits two microphones to be addressed. If the microphone's L/R pin 642 is tied to GND, this microphone drives the DATA only during falling CLK edge. If the microphone's L/R pin 642 is tied to VDD, this microphone drives the DATA during rising CLK edge. Therefore, with the system shown in FIG. 3, two microphones can be driven by the same clock and the L/R bit is used to distinguish data out from each of the microphones. For this example, using the modified KNOWLES® device, the clock can be operating in the range of 1 to 3.25 MHz.

To accomplish creating a fractional time delay in the microphone output signal, the oversampled output 620 is input into a Fractional Delay Block 622. The input to the Fractional Delay Block 622 is coupled to the output 620 of the PDM modulator 616. The Fractional Delay Block 622 is coupled to the clock signal (CLK) 624. The Fractional Delay Block 622 is coupled via 626 to control logic at 634 and is coupled via 628 to the bidirectional input/output (BIDI I/O 630. The control logic 634 is coupled at 636 to BIDI I/O 630, the CLK line 624 via 638, the L/R pin 642, and to the Fractional Delay Block 622.

In operation, the Fractional Delay Block 622 receives as an input the output 620 from the PDM modulator 616 and introduces a time delay thereby outputting at 628 a time delayed version of its input 620 where the time delay applied is a fraction of a baseband clock period. Fractional time delay in the oversampled domain is described more fully in U.S. Ser. No.: 15/225,745. As used in this description of embodiments, the terms "fractional time delay" or "fractional delay" can be greater than a period of a baseband clock cycle. For example, the fractional time delay applied at 622 can include one or more integer periods of a baseband clock cycle plus a fraction thereof. Note that the fractional time delay is still applied in the oversampled domain not in the baseband domain.

The magnitude of the time delay applied by the Fractional Delay Block 622 is programmable and can be selected from a range of values based on the ratio of the sampling clock frequency to the baseband clock frequency and the period of the sampling clock. In one example, a Fractional Delay Block 622 can be programmed to apply a number of time delay elements, where the number ranges from 0 to 512 delay elements, where a delay element provides a time delay that is equal to a sampling clock period.

Addition of one or more addressing pins ADDR1 644 and/or ADDR2 646 requires extra electrical connections to be provided in the footprint of an existing digital microphone package since existing digital microphones are packaged in a form factor that contemplates two channels using the terms L (left) and R (right) to designate the two channels. Adding addressing pin ADDR1 644 provides two bits to address up to four microphones, i.e., ADDR1 and L/R.

Using the one byte address, described above assigns the bits with modification as follows: Bits 7-2 (appropriately chosen Magic Word extension), bit 1: ADDR1, bit 0: L/R (the least significant bit is used for the state of the L/R pin).

Addition of an additional addressing pin ADDR2 646 increases the bits used for addressing microphones to three bits which can provide for addressing up to eight microphones. Using the one byte address, described above, assigns the bits with modification as follows: Bits 7-4 (Magic Word extension "0x6"), bit 3: reserved to support more than 8 microphones, bit 2: ADDR2, bit 1: ADDR1, bit 0: L/R (the Least significant bit is used for the state of the L/R pin). Expansion beyond eight microphones requires additional addressing pins, for example, adding ADDR3 provides four bits which will address six teen microphones. In some embodiments, the number of microphones may grow to the point where the Address will require more than one byte in order to accommodate the Magic Word and the bits used for the microphones' addresses. The examples provided herein are given merely for illustration and do not limit embodiments of the invention.

Figure 7:
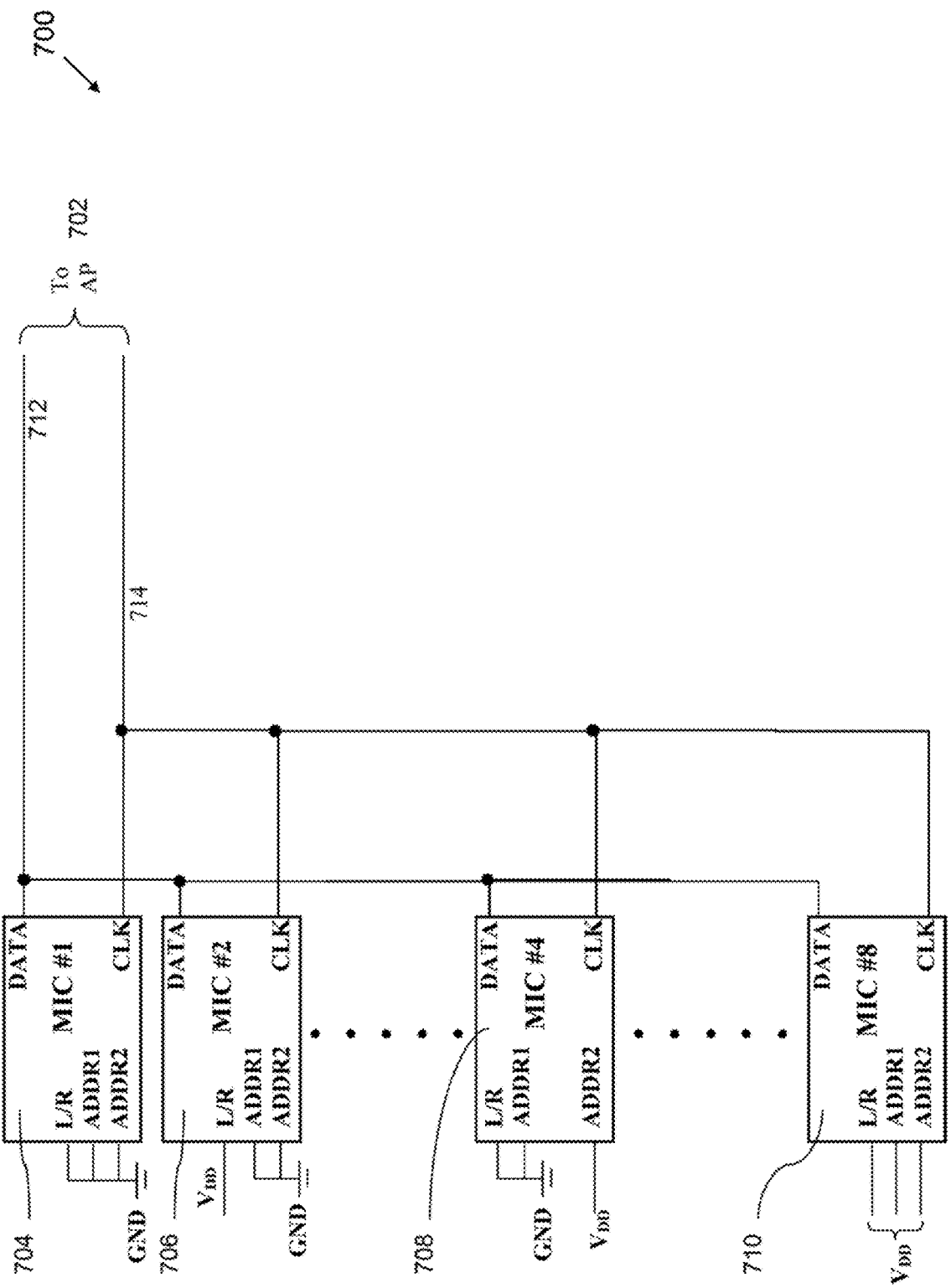
FIG. 7 illustrates a first bus architecture for a multi-microphone system providing programmable fractional time delays, according to embodiments of the invention.

FIG. 7 illustrates, generally at 700, a first bus architecture for a multi-microphone system providing programmable fractional time delays, according to embodiments of the invention. With reference to FIG. 7, a bus architecture for eight microphones is illustrated. An AP processor, indicated at 702, uses values of the ADDR2, ADDR1, and L/R pins at each microphone to address a particular microphone from the MIC #1 through MIC #8, indicated by 704, 706, 708, and 710. Note that, as before, all of the microphones use the common data line (DATA) 712 and sampling clock line (CLK) 714. The bus architecture illustrated in FIG. 7 requires the addition of two addressing pins ADDR1 and ADDR2 at each microphone, thereby providing, together with the L/R pin, three bits for addressing where each microphone's address is established by the values of the L/R pin, the ADDR1 pin, and the ADDR2 pin, all of which are set uniquely for each microphone. The values of the L/R pin, the ADDR1 pin, and the ADDR2 pin are shown for microphones 704, 706, 708, and 710 in FIG. 7. FIG. 7 shows the addressing scheme for up to 8 microphones.

Alternatively, in an embodiment that follows the architecture of FIG. 7, that only adds one additional address pin, i.e., ADDR1, four microphones can be addressed by using the value of the L/R pin and the value of the ADDR1 pin thereby establishing four unique addresses.

Alternatively, in another embodiment that follows the architecture of FIG. 7, that adds three additional addressing pins, sixteen microphones can be addressed by using four addressing bits provided by the values of the L/R pin, ADDR1 pin, ADDR2 pin, and ADDR3 pin. The values of these four pins are uniquely established at each of the 16 microphones. Thus, a flexible schema is provided that permits any number of microphones to be addressed by adding the requisite number of addressing pins and expansion of the size of the address as needed.

Figure 8:
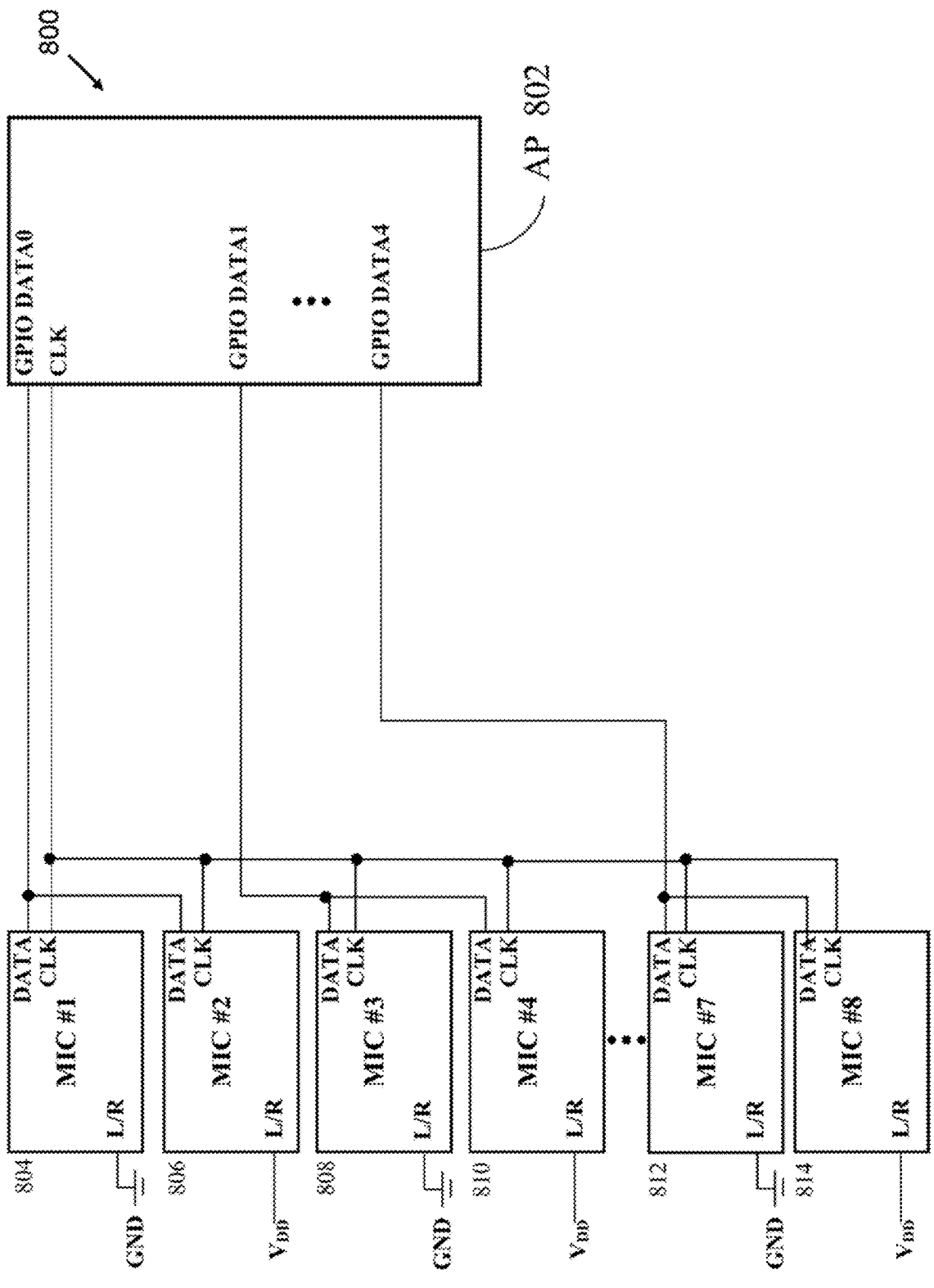
FIG. 8 illustrates a second bus architecture for a multi-microphone system providing programmable fractional time delays, according to embodiments of the invention.

FIG. 8 illustrates, generally at 800, a second bus architecture for a multi-microphone system providing programmable fractional time delays, according to embodiments of the invention. With reference to FIG. 8, a separate DATA line is needed for each pair of the microphones being added. This architecture requires a modification to the AP processor in order to provide the required number of unique data lines needed for the number of microphones implemented in a system. For example, an AP Processor is illustrated at 802. On the AP processor 802, GPIO DATA0 is shared between MIC #1 indicated at 804 and MIC #2 indicated at 806. The AP processor 802 uses two microphones only on GPIO DATA0, (MIC #1 804 and MIC #2 806); addressing the microphones as described above in conjunction with FIG. 5 by utilizing the value of the L/R pin to distinguish each microphone on the data line. GPIO DATA1 is shared between MIC #3 indicated at 808 and MIC #4 indicated at 810. GPIO DATA4 is shared between MIC #7 indicated at 812 and MIC #8 indicated at 814 and so on. Note that all eight microphones receive a common clock signal indicated by CLK. The system of FIG. 8 can be expanded to add more than the eight microphones shown by adding additional GPIO DATA lines, where each additional GPIO DATA line connects to an additional microphone or microphone pair. Thus, a system can be created for a general number of microphones by adding GPIO DATA# lines where the symbol "#" indicates the number of lines in a system. The number of microphones capable of being addressed in such as system is equal to twice the number "#" of data lines.

Note that embodiments of the invention are flexible with respect to the number of microphones that can be configured into a system for programming the fractional time delay(s). According to various embodiments, a system is designed by selecting the number of microphones that will be used. Next an addressing schema is designed that will accommodate the number of microphones selected. An intermediate frequency is selected to place the system into programming mode. Then a value for a timer is set based on the number of microphones selected and the intermediate frequency chosen such that the programming can be accomplished before the microphones become active. Thus, contention on the bidirectional I/O bus is avoided by the proper selection of a timer value in conjunction with the time needed to accomplish programming of the fractional time delay values into the fractional delay blocks of the microphones.

Time Delay Circuits

Figure 9:
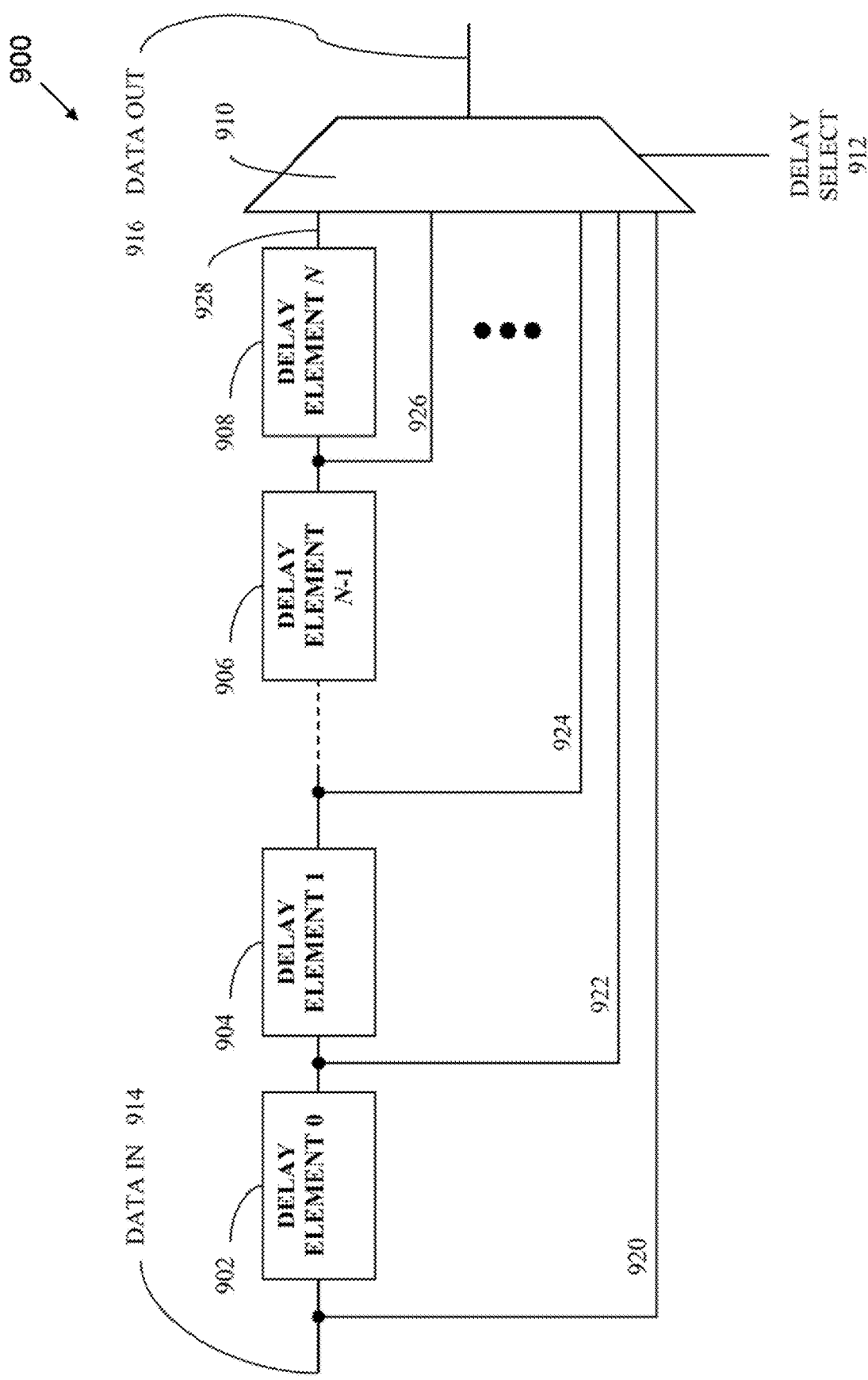
FIG. 9 illustrates the fractional time delay block, according to embodiments of the invention.

FIG. 9 illustrates, generally at 900, the Fractional Delay Block described above in the preceding figures, according to embodiments of the invention. With reference to FIG. 9, a number of delay elements 0 through N, indicated by 902 for delay element 0, 904 for delay element 1, 906 for delay element N-1 and 908 for delay element N, are configured with a multiplexer 910 such that a control signal 912 labeled "delay select" operates the multiplexer 910 to select a number of delay elements that corresponds to the fractional time delay of interest. In operation, a value for "delay select" results from the Programming process described above and it is either the time delay value or meta data related to the time delay value. For example, in a system configured with a time delay that can range from 0 to N sampling clock cycles, the data programmed by the Programming process described above is a number in the range of 0 to 512, i.e., meta data related to the time delay value. Alternatively, the data programmed during the Programming process can be the actual time delay of interest. In operation, the signal on DATA IN at 914 is time delayed by the programmed time delay value (or it is time delayed using the programmed meta data which is related to the desired time delay value, e.g., number of sampling clock cycles N) to provide a time delayed representation of the signal at DATA OUT at 916. The delay select signal 912 can be configured to cause time delayed signal 922 to be output at 916, thereby resulting in application of a time delay of magnitude equal to DELAY ELEMENT 0 902. The delay select signal 912 can be configured to cause time delayed signal 924 to be output at 916, thereby resulting in application of a time delay of magnitude equal to the sum of DELAY ELEMENT 0 902 and DELAY ELEMENT 1 904. The delay select signal 912 can be configured to cause time delayed signal 926 to be output at 916, thereby resulting in application of a time delay of magnitude equal to the sum of DELAY ELEMENT 0 902 through DELAY ELEMENT N-1 906. The delay select signal 912 can be configured to cause time delayed signal 928 to be output at 916, thereby resulting in application of a time delay of magnitude equal to the sum of DELAY ELEMENT 0 902 through DELAY ELEMENT N 908. Selection of 920 results in a bypass where the signal at DATA IN 914 is output directly at 916 without application of a time delay. Delay elements 902, 904 through 906, and 908 are realized utilizing various circuits such as groups of paired inverts or flip-flops. A third type of circuit can utilize SRAM bits in a FIFO buffer (circular buffer) to accomplish the programmable time delay.

In FIG. 9, the DELAY SELECT signal 912 is provided from the Control Logic Block (e.g., 334 in FIG. 3 or 634 in FIG. 6) via delay register. The DELAY SELECT signal 912 is created based on information obtained from the Programming process described above. Individual delay elements are created in different embodiments using different circuits as described below.

In some embodiments, the fractional delay block 900 is not programmable but instead presents a fixed time delay to a signal coupled to its input DATA IN at 914. In one or more embodiments, a fixed delay fractional delay block is configured without the multiplexer 910 or the delay select 912. Instead, a signal connected to DATA IN 914 passes through a set number of N time delay elements and is output at DATA OUT 916. A magnitude of a time delay provided by the time delay elements can be designed to be equal to 0, 1, or any desired number of sampling clock periods.

Flip Flops

Figure 10:
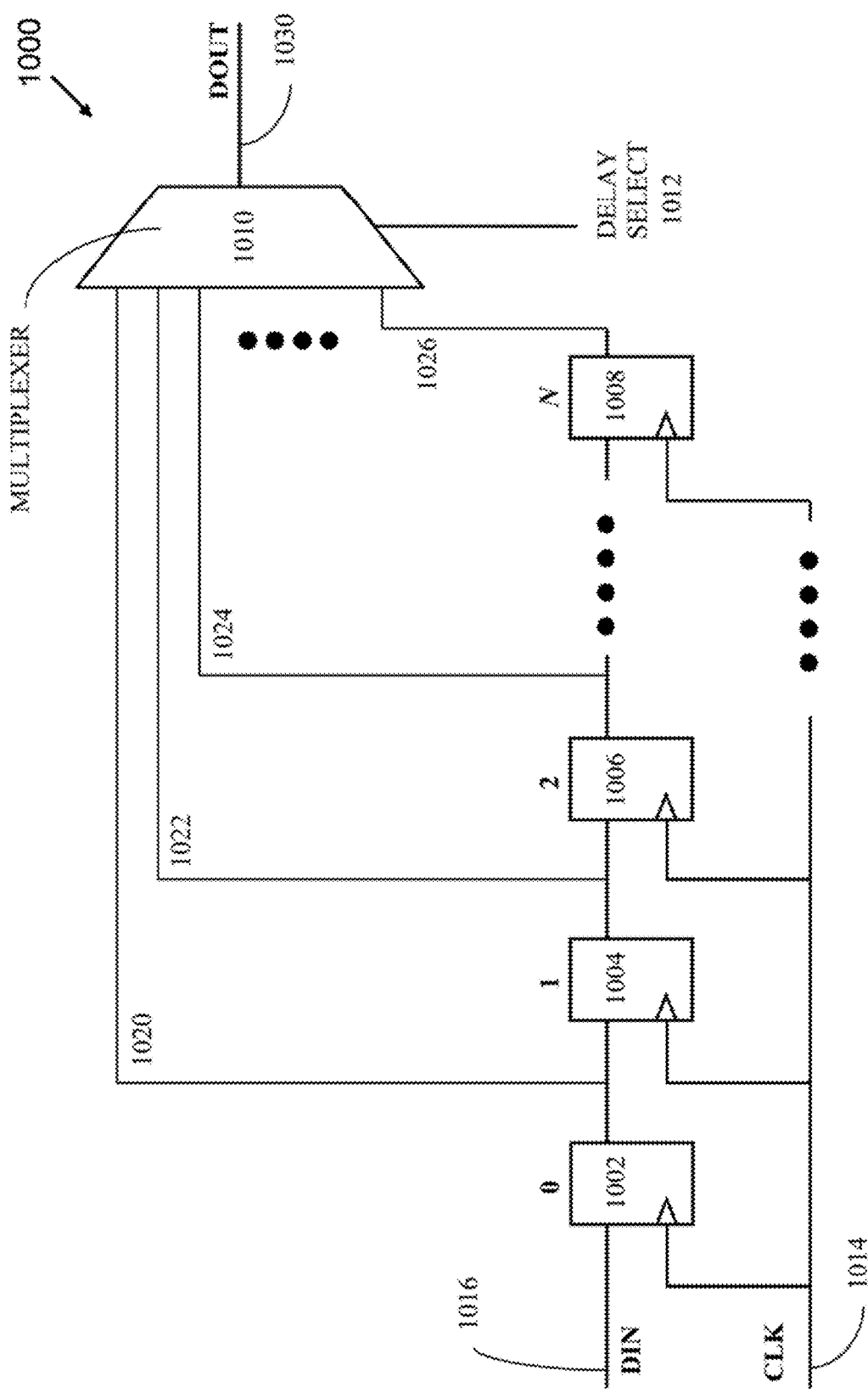
FIG. 10 illustrates the fractional time delay block of FIG. 9 implemented with flip flops, according to embodiments of the invention.

FIG. 10 illustrates, generally at 1000, the fractional time delay block of FIG. 9 implemented with flip flops, according to embodiments of the invention. With reference to FIG. 10, a general number of n flip flops indicated by 1002, 1004, 1006, through 1008 are configured serially with a multiplexer 1010. Each flip flop provides a unit time delay to an input signal 1016. An output 1020 of the flip flop 1002 is input into the multiplexer 1010 and is available for selection by the Delay Select signal 1012. A delay select signal appropriately configured to select time delay 1002 (1020) will cause the input signal (DIN) 1016 to be time delayed by the flip flop 1002 thereby resulting in time delayed signal 1020 to be the one selected for output at 1030 from the multiplexer 1010.

In similar fashion, an output 1022 of flip flop 1004 is input into the multiplexer 1010 and is available for selection by the Delay Select signal 1012. A Delay Select signal 1012 appropriately configured to select time delay sum 1002 and 1004 (1022) will cause the input signal 1016 to be time delayed by the flip flops 1002 and 1004 thereby resulting in time delayed signal 1022 to be the one selected for output at 1030 from multiplexer 1010.

In similar fashion, an output 1024 of flip flop 1006 is input into the multiplexer 1010 and is available for selection by the Delay Select signal 1012. A Delay Select signal 1012 appropriately configured to select time delay sum 1002, 1004, and 1006 (1024) will cause the input signal 1016 to be time delayed by the flip flops 1002, 1004, and 1006 thereby resulting in time delayed signal 1024 to be the one selected for output at 1030 from multiplexer 1010.

In similar fashion, an output of the $n^{th}$ flip flop 1008 is input into the multiplexer 1010 and is available for selection by the Delay Select signal 1012. A Delay Select signal 1012 appropriately configured to select time delay sum 1002,

1004, 1006 through 1008 (1026) will cause the input signal 1016 to be time delayed by the flip flops 1002, 1004, through 1008 thereby resulting in time delayed signal 1026 to be the one selected for output at 1030 from multiplexer 1010.

Similarly, any intermediate selection between 1024 and 1026 will result in the selected time delayed version of the input signal 1016 output at 1030 from the multiplexer 1010.

In various embodiments, an individual time delay element is provided using a single flip flop running at the clock frequency represented by CLK (1014), thereby providing a unit time delay based on the clock frequency. A given programmable time delay is obtained from one or more flip flops by using the multiplexer (e.g., 910 in FIG. 9 and 1010 in FIG. 10) to limit the number of flip flops that are active for the given programmable time delay. To save power, the flip flops that do not participate in providing the desired time delay are powered down and do not toggle. The number of flip flops used to provide a range of programmable time delay depends on the ratio of the sampling clock frequency to baseband clock frequency. In one non-limiting example using 4.096 MHz as the frequency of the sampling clock and 8 kHz as the frequency of the baseband clock, 512 flip flops are required to provide a programmable delay that is selectable from the range of 0 to 512 unit time delays, where the time interval of the unit time delay is equal to the sampling clock period, i.e., UNIT TIME DELAY=1/(4.096 MHz) in this non-limiting example.

Note that when flip flops are used to provide the programmable time delay, as described above, a portion of the 512 flip flops can be used in a system that has a different sampling clock frequency and or a different baseband clock frequency. For example, if the sampling clock frequency is 2.048 MHz and the baseband clock frequency is 8 KHz, then the ratio of these two clock frequencies yields 256 as the number of flip flops required to provide a programmable fractional delay that spans a range of between 0 to 256 unit time delays. In some embodiments, the Fractional Delay Block is designed to accommodate a range of different sampling clock frequencies and baseband clock frequencies. Logic is used to determine a number of unit time delays that corresponds to a desired programmable time delay. In such a system implementation, a single microphone system can be used in different applications (different sampling clock frequencies and baseband clock frequencies) and automatically adapt to the given application by using the correct number of flip flops for a programmable time delay of interest. The circuit of FIG. 10 can be configured with a bypass as described in FIG. 9, such that an appropriately configured Delay Select signal at 1012 would cause the signal input at 1016 to be output at 1030 without application of a time delay.

In some embodiments, the fractional delay block 1000 is not programmable but instead presents a fixed time delay to a signal coupled to its input DIN at 1016. In one or more embodiments, a fixed delay fractional delay block is configured without the multiplexer 1010 or the delay select 1012. Instead, a signal connected to DIN 1016 passes through a set number of N flip flops and is output at DOUT 1030. A magnitude of a time delay provided by the fractional delay block can be designed to be equal to 0, 1, or any desired number of sampling clock periods by appropriate arrangement of the number of flip flops in series as shown in FIG. 10.

Paired Inverters

Figure 11:
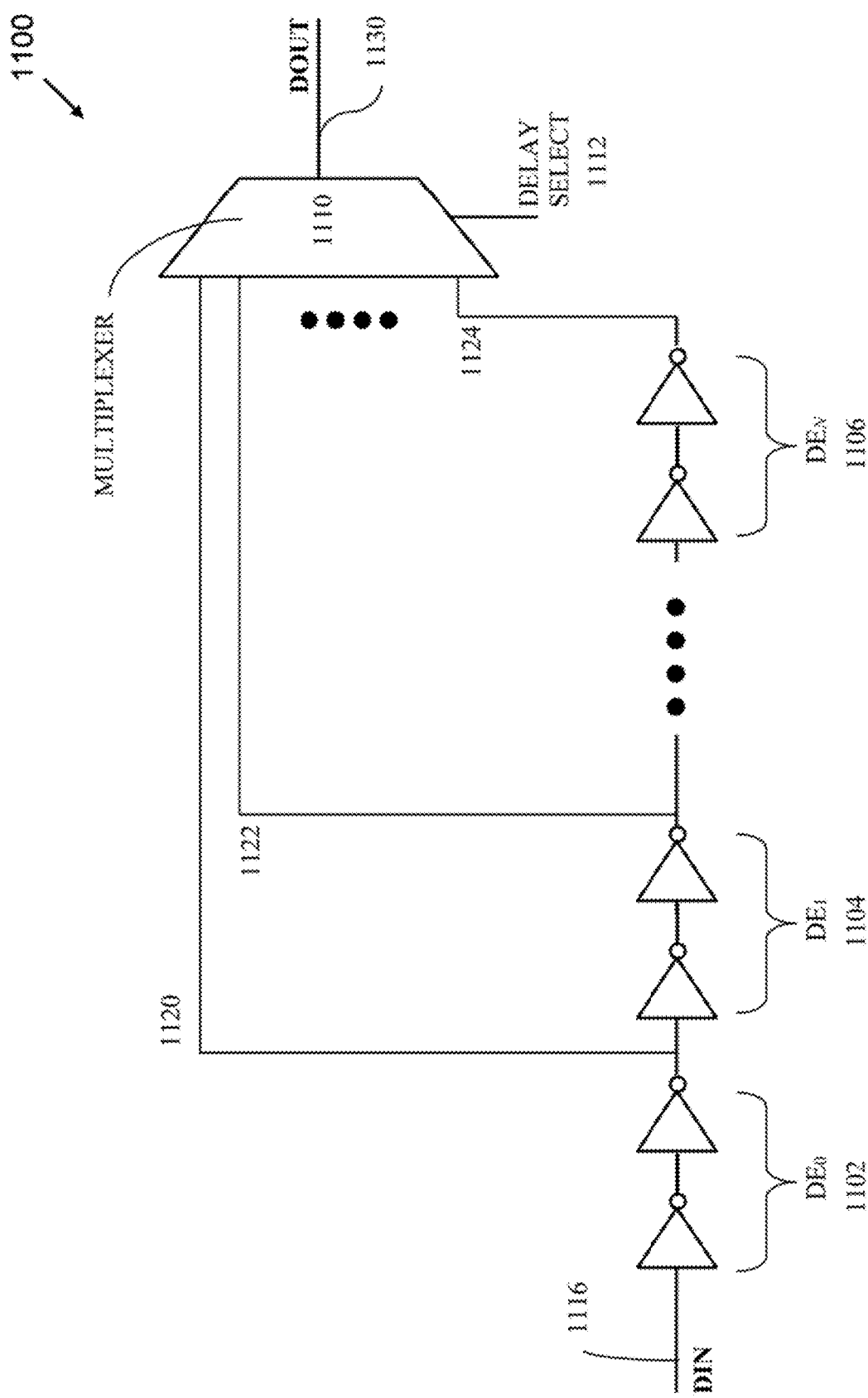
FIG. 11 illustrates the fractional time delay block of FIG. 9 implemented with pairs of inverters, according to embodiments of the invention.

FIG. 11 illustrates, generally at 1100, the fractional time delay block of FIG. 9 implemented with pairs of inverters, according to embodiments of the invention. With reference to FIG. 11, a number N of paired inverters indicated by 1102, 1104 through 1106 are configured serially and are input into a multiplexer 1110. A signal 1116 is input into the first pair of inverters 1102. An output 1120 from the first pair of inverters 1102 is input into the multiplexer 1110 and is available for selection by an appropriately configured Delay Select signal 1112. If Delay Select signal 1112 is configured to select 1102 then time delayed signal 1120 is output at 1130 from the multiplexer 1110.

A signal 1116 is input into the first pair of inverters 1102 and is tapped off at 1122 after passing through the first two pairs of inverters 1102 and 1104. An output 1122 from the second pair of inverters 1104 is input into the multiplexer 1110 and is available for selection by an appropriately configured Delay Select signal 1112. If Delay Select signal 1112 is configured to select a time delay equivalent to the sum of 1102 and 1104 then time delayed signal 1122 is output at 1130 from the multiplexer 1110.

A signal 1116 is input into the first pair of inverters 1102 and the output 1124 from the last pair of inverters 1106 is input into the multiplexer 1110. The output 1124 from the last pair of inverters 1106 is input into the multiplexer 1110 and is available for selection by an appropriately configured Delay Select signal 1112. If Delay Select signal 1112 is configured to select a time delay equivalent to the sum of 1102 through 1106 then time delayed signal 1122 is output at 1130 from the multiplexer 1110.

Similarly, any intermediate selection between 1102 and 1106 will result in the selected time delayed version of the input signal 1116 output at 1130 from the multiplexer 1110.

In various embodiments, one or more pairs of inverters, e.g., 1102, 1104 through 1106 (FIG. 11) are used to provide the fractional time delay element, such as Delay Element 0 at 902, Delay Element 1 at 904, Delay Element N-1 at 906, and Delay Element N at 908 in FIG. 9. A group of paired inverters is then used to provide a time delay that is selected by the Delay Select 112 signal sent to the multiplexer. An inverter pair is designed to provide a specific unit time delay (propagation time) through the pair by selection of semiconductor parameters, such as device width (W), device length (L), load capacitance $C_L$, supply voltage $V_{DD}$, etc. With sampling clocks frequencies in the Megahertz range (typically 1.0 MHz to 4.096 MHz) the unit time delay will vary, e.g., from 1/(1.0 MHz) to 1/(4.096 MHz) depending on the sampling clock frequency used in a given microphone design. Similarly, for a given system design the baseband clock frequency can vary for example, in the Kilohertz range of 4 kHz to 8 kHz. For example, in one non-limiting example, with a sampling clock of 4.096 MHz and a baseband clock frequency of 8 kHz, division of 4.096 MHz by 8 kHz equals 512 unit time delays. Thus, in one embodiment, one or more pairs of inverters is used to provide a unit time delay of 1/(4.096 MHz) and a group of paired inverters is designed to provide a programmable delay that ranges in value from 1/(4.096 MHz) to 512*(1/(4.096 MHz)).

In some embodiments, the fractional delay block 1100 is not programmable but instead presents a fixed time delay to a signal coupled to its input DIN at 1116. In one or more embodiments, a fixed delay fractional delay block is configured without the multiplexer 1110 or the delay select 1112. Instead, a signal connected to DIN 1116 passes through a set number of N paired inverters and is output at DOUT 1130. A magnitude of a time delay provided by a number of paired inverters can be designed to be equal to 0, 1, or any desired number of sampling clock periods by appropriate arrangement of the number of paired inverters.

FIG. 12A illustrates, generally at 1200, various applications and the corresponding sampling data that pertains to a given application. With reference to FIG. 12A, various applications for acoustic microphones are listed in column 1202. Column 1204 lists the PDM clock frequencies (over-sampled domain) for the applications listed in column 1202. Column 1206 lists the decimation ratio that is applied to the PDM clock frequencies shown in column 1204. Column 1208 lists the baseband sampling rate resulting from applying the decimation ratio of column 1206 to the PDM clock frequency in column 1204. Column 1210 shows the audio bandwidth that corresponds to the baseband sampling rate of column 1208. The audio bandwidth column 1210 is ½ of the baseband sampling rate in order to satisfy the Nyquist criteria and avoid aliasing.

Figure 12B:
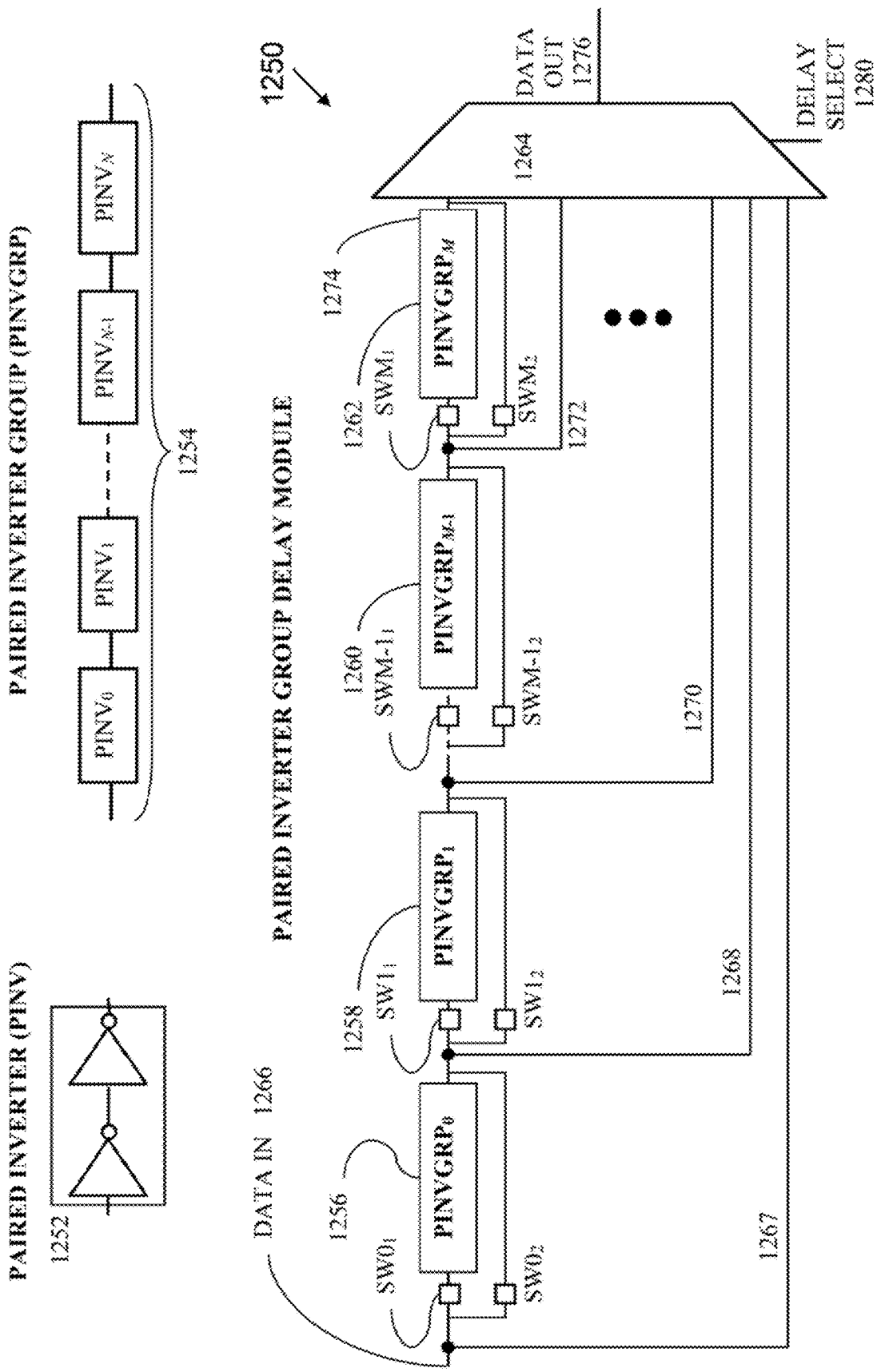
FIG. 12B illustrates a fractional time delay block utilizing groups of paired inverters, according to embodiments of the invention.
Figure 13E:
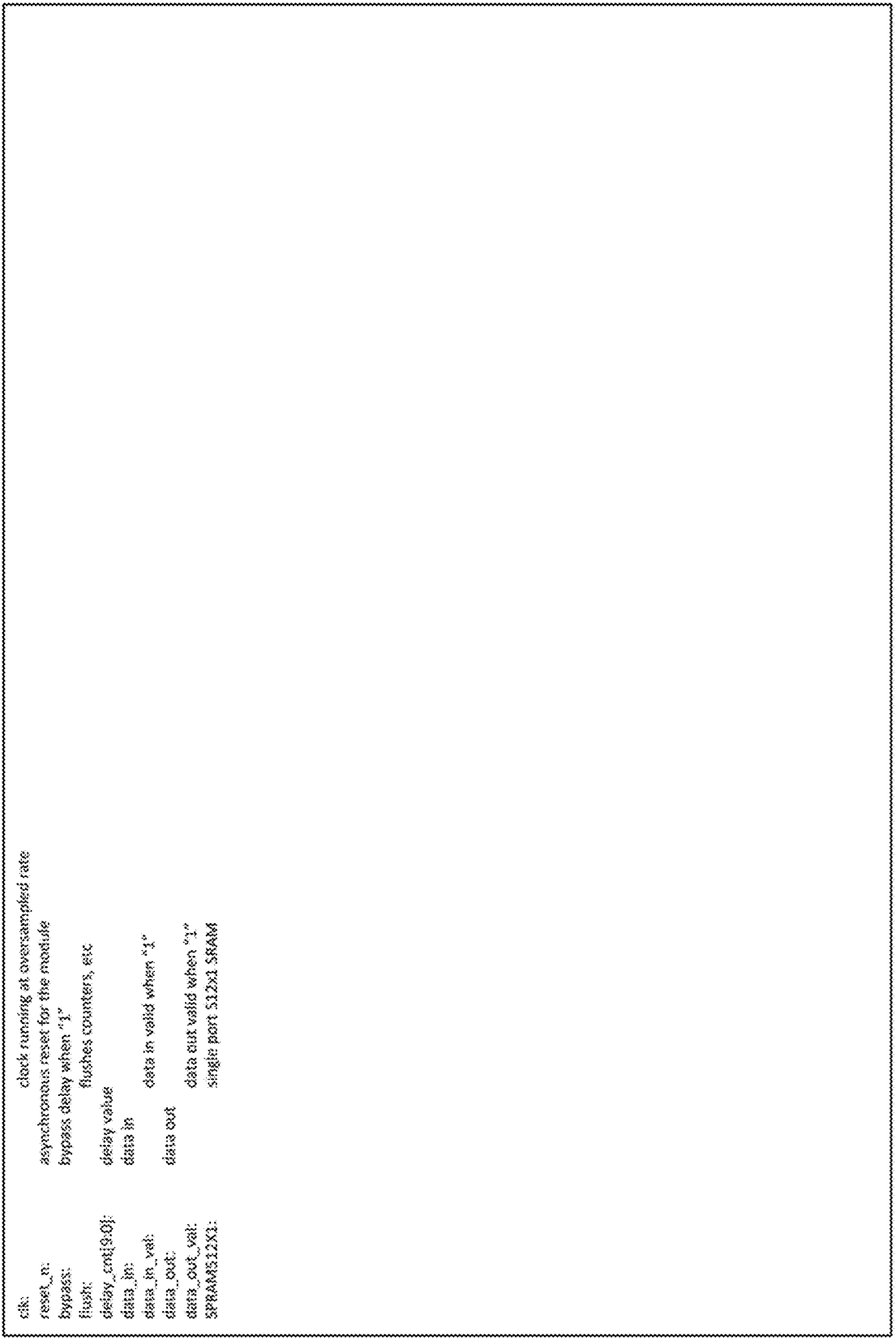

FIG. 12B illustrates a fractional time delay block utilizing groups of paired inverters, according to embodiments of the invention. With reference to FIG. 12B, paired inverter (PINV) 1252 represents the basic time delay element utilizing two inverters. Paired inverter group (PINVGRP) 1254 represents the least significant common number of grouped pairs of inverters PINV such that a multiple of this delay represents a sub-fractional delay for a given sampling rate. The time delay provided by PINVGRP 1254 is measured for a given silicon geometry and process and is therefore geometry and process dependent. The oversampling clock frequency varies, according to the application. With typical oversampling clock frequencies being in the range of those shown in FIG. 12A. In various embodiments, a design process tor selecting PINV 1252 and PINVGRP 1254 proceeds by considering a range of oversampling clock frequencies and then determining a sub-fractional delay that can be used for the desired range. For example, in one embodiment that accommodates two sampling clock frequencies, i.e., 2.4 MHz and 4.8 MHz (an example shown in FIG. 12A with Full-bandwidth audio and Ultrasound) a minimum fractional delay equal to one sampling clock period at 4.8 MHz represents a sub-fractional delay for the 2.4 MHz sampling frequency, since the minimum fractional delay at 2.4 MHz is twice the minimum fractional delay at 4.8 MHz. In one or more embodiments, to achieve a 16 kHz sampling rate a sampling clock frequency of 2.048 MHz is used. 2.048 MHz is used only for illustration and does not limit embodiments of the invention.

In some implementations of embodiments of the invention, multiple sets of groups of paired inverters are used accommodate a plurality of possible sampling clock frequencies and baseband clock frequencies. In other implementations, a unit time delay, and multiples thereof are designed to be used with a variety of combinations of sampling clock frequencies and baseband clock frequencies. An additional gate can be used on the front of each group of paired inverters for the purpose of enabling a particular group.

Referring to 1250 in FIG. 12B, the fractional time delay block of FIG. 9 is implemented with groups of paired inverters, according to embodiments of the invention. With reference to FIG. 12B, a number m groups of paired inverters is indicated by 1256, 1258, 1260 through 1262 and are configured serially and are input into a multiplexer 1264. A signal 1266 is input into the first group of paired inverters 1256. An output 1268 from the first group of paired inverters 1256 is input into the multiplexer 1264 and is available for selection by an appropriately configured Delay Select signal 1280. If Delay Select signal 1280 is configured to select 1268 then time delayed signal 1268 is output at 1276 from the multiplexer 1264.

A signal 1266 is input into the first group of paired inverters 1256 and is tapped off at 1270 after passing through the first two groups of paired inverters 1256 and 1258. An output 1270 from the second group of paired inverters 1258 is input into the multiplexer 1264 and is available for selection by an appropriately configured Delay Select signal 1280. If Delay Select signal 1280 is configured to select a time delay equivalent to the sum of 1256 and 1258 then time delayed signal 1270 is output at 1276 from the multiplexer 1264, A signal 1266 is input into the first group of paired inverters 1256 and is tapped off at 1272 after passing through n-1 groups of paired inverters up to and including 1260. An output 1272 from the n-1 group of paired inverters 1260 is input into the multiplexer 1264 and is available for selection by an appropriately configured Delay Select signal 1280. If Delay Select signal 1280 is configured to select a time delay equivalent to the sum of 1256 through 1260 then time delayed signal 1272 is output at 1276 from the multiplexer 1264.

A signal 1266 is input into the first group of paired inverters 1256 and is tapped off at 1274 after passing through m groups of paired inverters 1262. An output 1274 from the $m^{th}$ group of paired inverters 1262 is input into the multiplexer 1264 and is available for selection by an appropriately configured Delay Select signal 1280. If Delay Select signal 1280 is configured to select a time delay equivalent to the sum of 1256 through 1262 then time delayed signal 1274 is output at 1276 from the multiplexer 1264. Selection of 1267 results in a bypass where the signal at DATA IN 1266 is output directly at 1276 DATA OUT without application of a time delay.

Similarly, any intermediate selection between 1256 and 1262 will result in the selected time delayed version of the input signal 1266 output at 1276 from the multiplexer 1264.

In various embodiments, one or more groups of paired inverters, e.g., 1256, 1258 through 1260 and 1262 (FIG. 12B) are used to provide the fractional time delay element, such as Delay Element 0 at 902, Delay Element 1 at 904, Delay Element N-1 at 906, and Delay Element N at 908 in FIG. 9. A group of paired inverters is then used to provide a time delay that is selected by the Delay Select signal sent to the multiplexer.

Optionally, the fractional delay block 1250 is provided with switches $SW0_1$ and $SW0_2$ for paired inverter group 1256, switches $SW1_1$ and $SW1_2$ for paired inverter group 1258, switches $SWM\text{-}1_1$ and $SWM\text{-}1_2$ for paired inverter group 1260, and switches $SWM_1$ and $SWM_2$ for paired inverter group 1262. In operation, switches $SW0_1$ and $SW0_2$ are used to either keep paired inverter group 1256 in the delay presented to the multiplexer 1264 (by closing $SW0_1$ and opening $SW0_2$) or removing paired inverter group 1256 from the delay presented to the multiplexer 1256 (by opening $SW0_1$ and closing $SW0_2$) thereby allowing a signal input at DATA IN 1266 to bypass paired inverter group 1256). Similarly, switches $SW1_1$ and $SW1_2$ are used to either keep or remove the delay presented by paired inverter group 1258 from the multiplexer 1256. Switches $SWM\text{-}1_1$ and $SWM\text{-}1_2$ are used to either keep or remove the delay presented by paired inverter group 1260 from the multiplexer 1256. And switches $SWM_1$ and $SWM_2$ are used to either keep or remove the delay presented by paired inverter group 1262 from the multiplexer 1256. Any of the switches $SW0_1$, $SW0_2$, $SW1_1$, $SW1_2$, $SWM\text{-}1_1$, $SWM\text{-}1_2$, $SWM_1$, and $SWM_2$ can be realized with gates.

In some embodiments, the fractional delay block 1250 is not programmable, but instead presents a fixed time delay to a signal coupled to its input DATA IN at 1266. In one or more embodiments, a fixed delay fractional delay block is configured without the multiplexer 1264 or the delay select 1280. Instead, a signal connected to DATA IN 1266 passes through a set number of M groups of paired inverters and is output at DATA OUT 1276. A magnitude of a time delay provided by a number of M groups of paired inverters can be designed to be equal to 0, 1, or any desired number of sampling clock periods by appropriate arrangement of the number of groups of paired inverters.

SRAM Bit

In various embodiments, a programmable time delay is provided from a circuit constructed with static random access memory (SRAM) bits to provide a programmable time delay. In one or more embodiments, using SRAM, each unit time delay element corresponds to one bit of SRAM. A number of bits of SRAM are used to provide the required programmable time delay. For example, depending on the number of unit time delays required by a combination of sampling clock frequency and baseband clock frequency a number of bits of SRAM are configured to provide the different programmable fractional time delays. In the example above using 4.096 MHz as the sampling clock frequency and 8 kHz as the baseband clock frequency an array of 512×1 SRAM bits are configured as a first-in-first-out (FIFO) circulating buffer. A programmable time delay is then obtained utilizing a number of bits of SRAM. Logic is used together with the array of SRAM to determine which cell to write or read from in response to a given programmable time delay.

FIG. 13A-13E illustrates Verilog Hardware Description Language (HDL) code for implementing the 512×1 SRAM delay circuit shown in FIGS. 14A-14G, according to embodiments of the invention. With reference to FIGS. 13A-13E, Verilog HDL code is presented for an SRAM delay circuit that contains 512 delay elements. An example of 512 delay elements is given merely for example and does not limit embodiments of the invention. In various embodiments, SRAM delay circuits can be configured to provide more or less than 512 delay elements. FIGS. 13A-13E and FIGS. 14A-14G provide for an input of one bit.

Figure 14A:
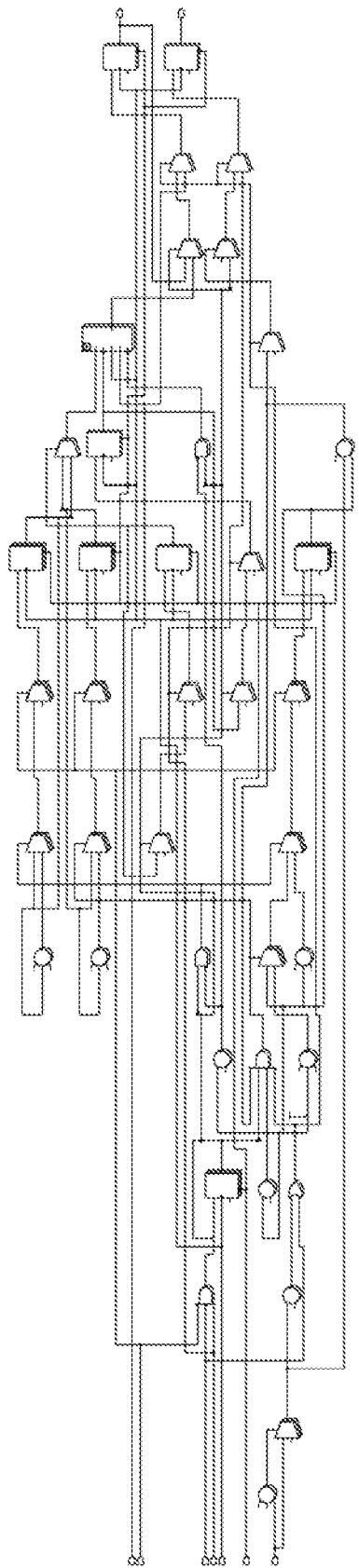
FIG. 14A-14G illustrates the circuit generated from the Verilog HDL code from FIGS. 13A-13E, according to embodiments of the invention.
Figure 14B:
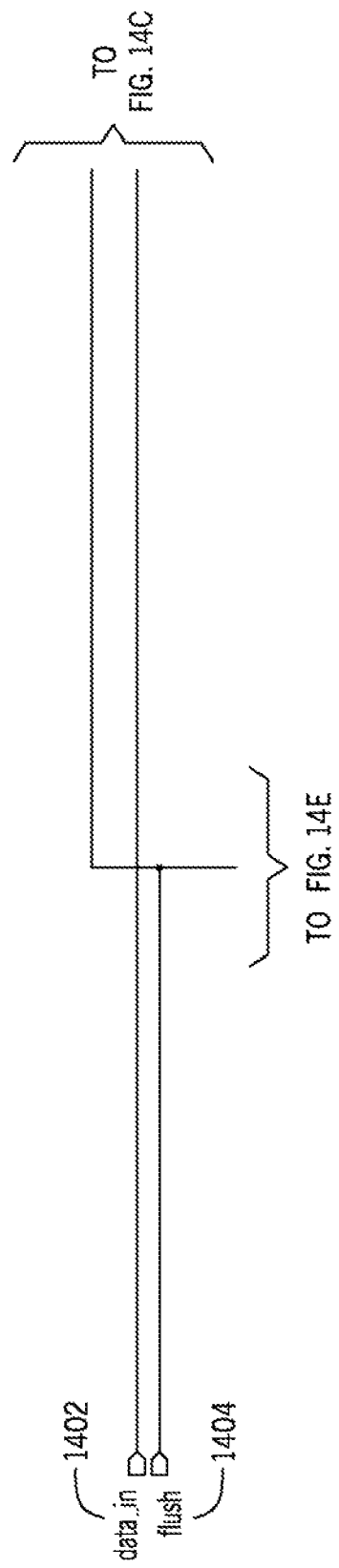
Figure 14C:
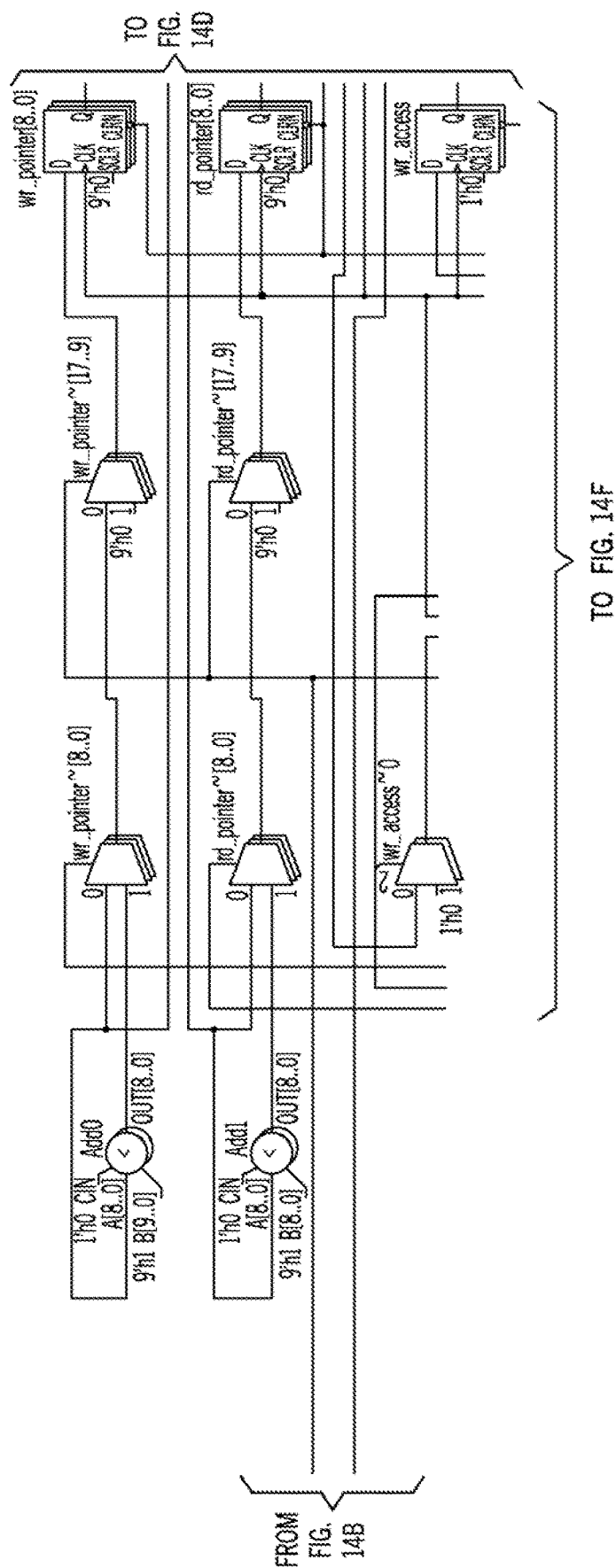
Figure 14D:
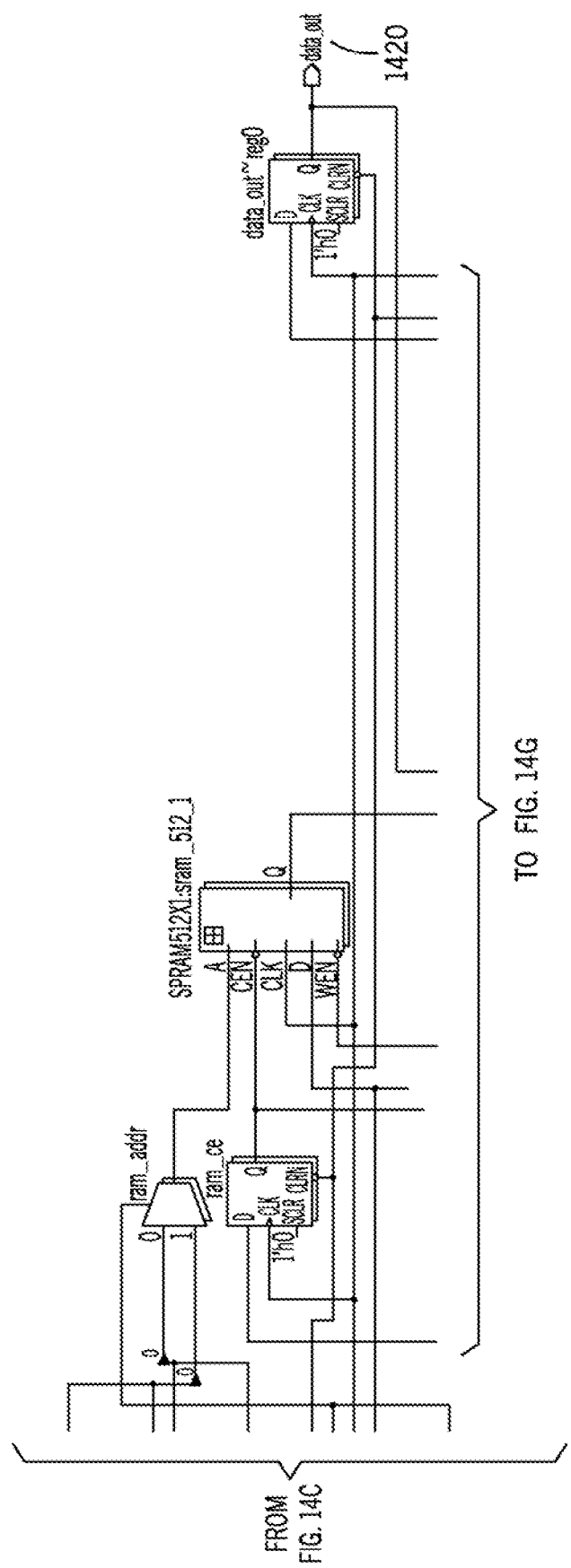
Figure 14E:
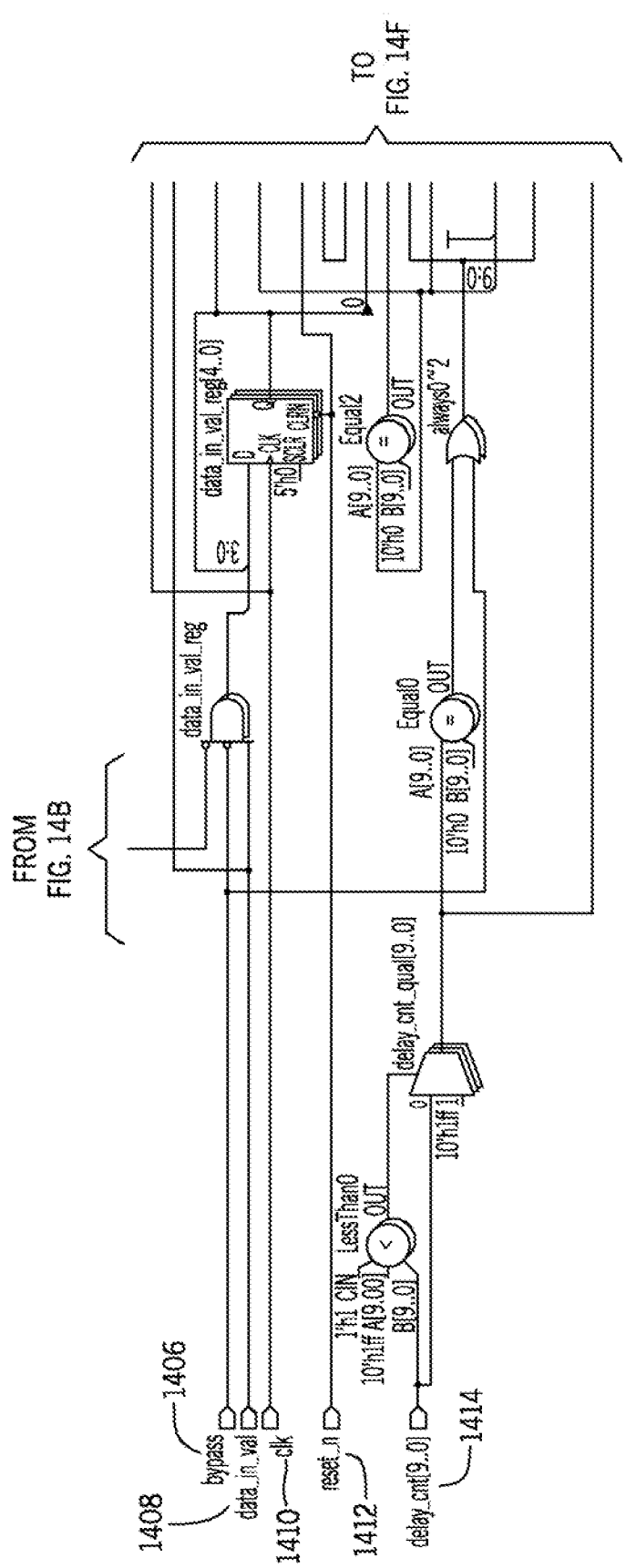
Figure 14F:
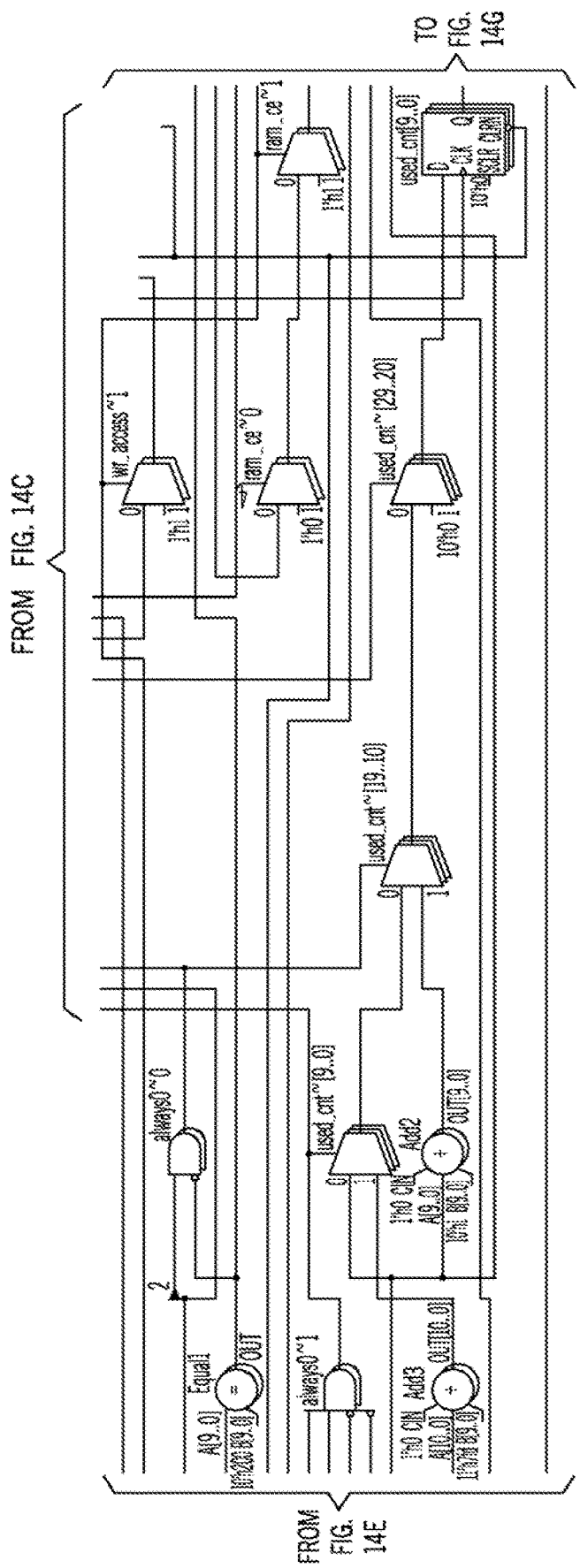
Figure 14G:
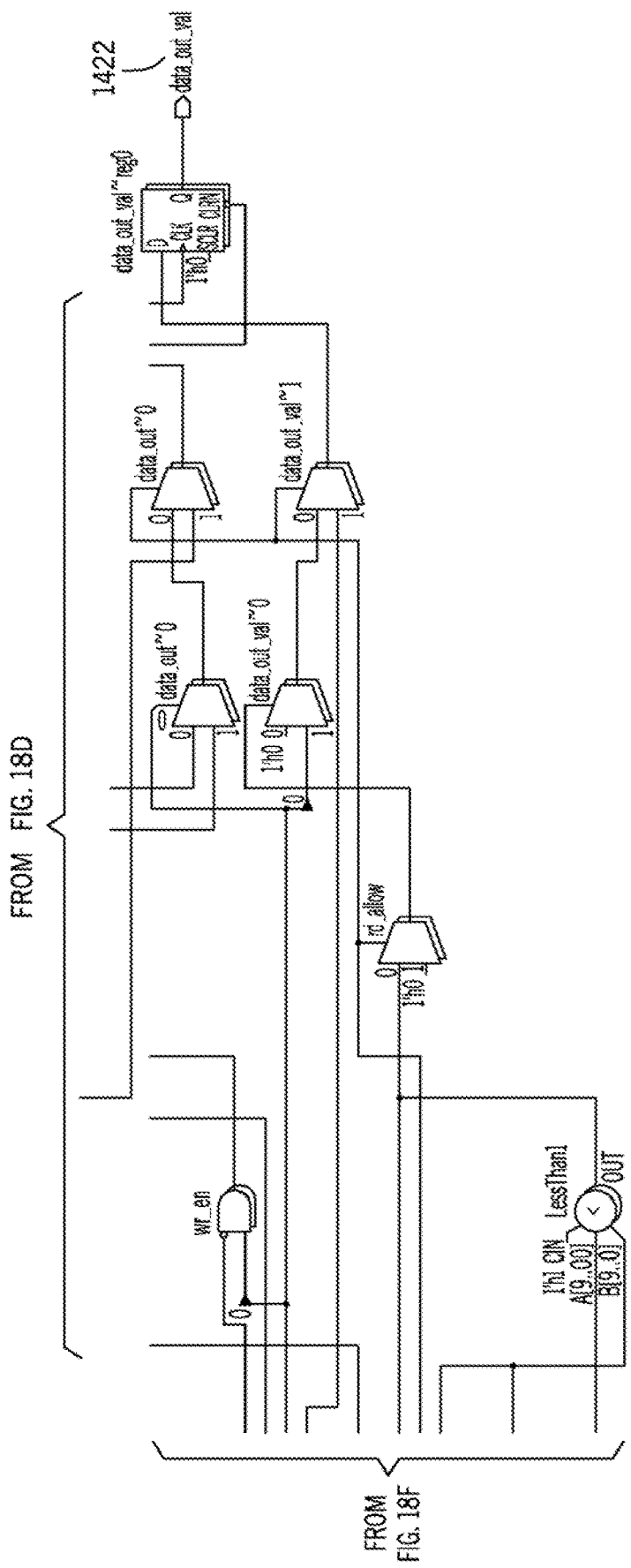

FIG. 14A-14G illustrates the circuit generated from the Verilog HDL code from FIGS. 13A-13E, according to embodiments of the invention. With reference to FIG. 14E an oversampled signal is input to the SRAM delay circuit at "data_in" 1402. Control logic is configured to work with the SRAM delay circuit to provide programming, reprogramming, pass through, reset, and other functionality as required by a given embodiment. For example, at power up a signal can be provided to "flush" 1404 to flush values from circuit elements before programming commences. The delay information, received during the programming step is input at "delay_cnt" 1414. In the example of FIG. 14A-14G the delay information is in the range 1 to 512. A clock signal is input at "clk" 1410. In operation, data input from the PDM Modulator at 1402 is delayed an amount specified by the delay information programmed through "delay_cnt" at 1414 and is output at "data_out" 1420 FIG. 14G. When data output at "data_out" 1420 is valid the "data_out_val" 1422 signal goes high in one or more embodiments.

When reprogramming mode is activated, a signal is sent to the "Flush" 1404 input before reprogramming occurs. A bypass is provided 1406. When a signal is sent to the bypass input 1406, data input from the PDM Modulator at 1402 passes through the SRAM delay circuit with no time delay imparted.

Thus, an SRAM delay circuit is used in various embodiments to provide a fractional delay to a Fractional Delay Block used in conjunction with control logic as described above in the preceding figures. Note that the particular SRAM circuit described above is provided as an example and does not limit embodiments of the invention.

In some embodiments, a fractional delay block made with an SRAM circuit is not programmable, but instead presents a fixed time delay to a signal coupled to its input "data_in" 1402. In one or more embodiments, a fixed delay fractional delay block is configured without the "delay_cnt" 1414. Instead, a signal connected to "data_in" 1402 passes through a set number of N bits and is output at "data_out" 1420. A magnitude of a time delay provided by the N bits can be designed to be equal to 0, 1, or any desired number of sampling clock periods by appropriate arrangement of the number of bits of SRAM used in the circuit.

Figure 15:
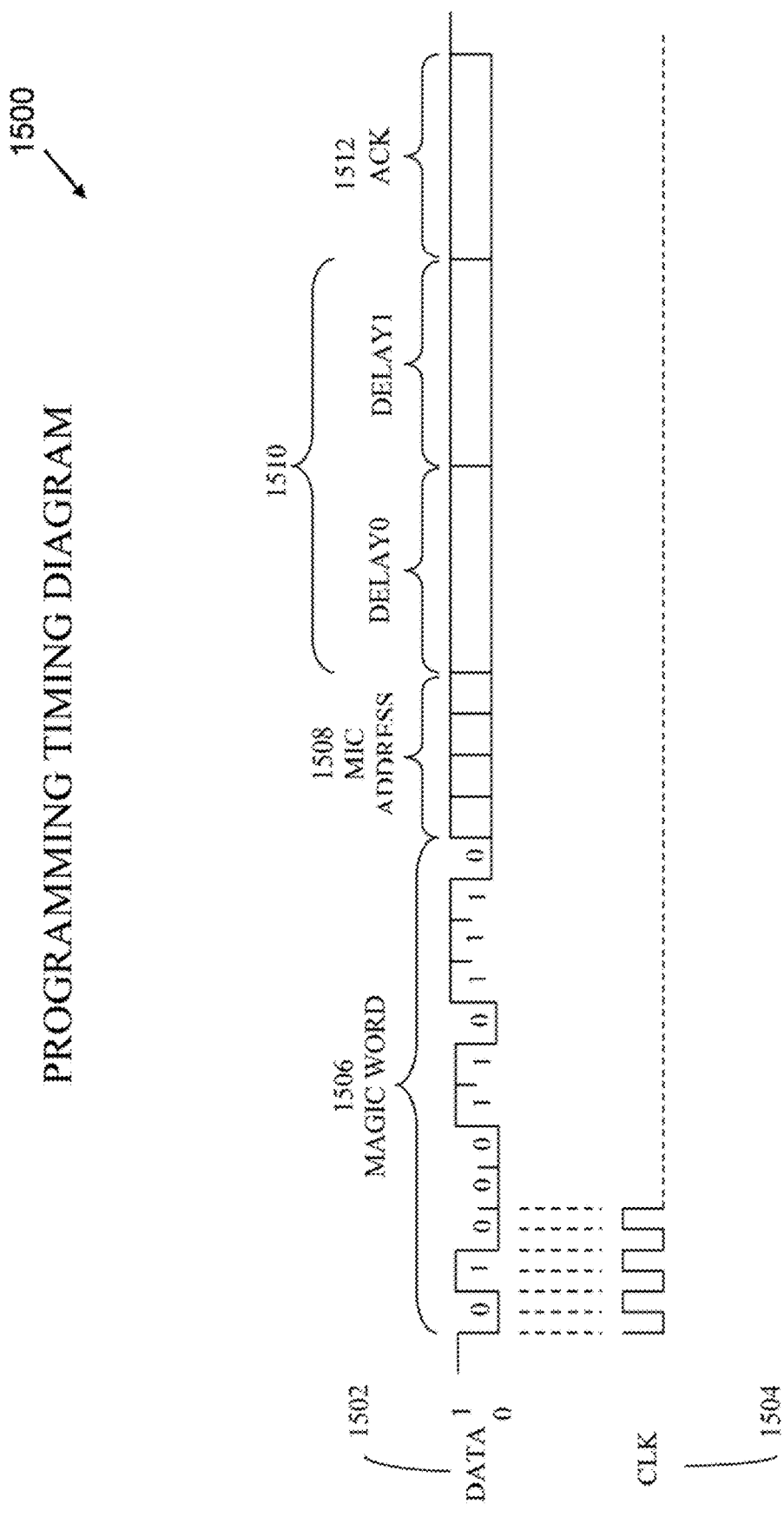
FIG. 15 illustrates a sequence of time delay programming data, according to embodiments of the invention.

FIG. 15 illustrates, generally at 1500, a sequence of time delay programming data, according to embodiments of the invention. As described above, in conjunction with the previous figures, at least one data line and one clock line connect one or more microphones with an Application Processor. Thus, the signals depicted in FIG. 15 are representative of the timing of data transmitted. With reference to FIG. 15, signals that would be transmitted on a DATA line and a portion of the corresponding clock signals for a microphone system as described above are presented, according to various embodiments. A DATA line 1502 and a clock line CLK 1504 are illustrated. The DATA line 1502 is sampled on the rising edge (↑) of the clock signal (CLK) 1504 and the DATA line 1502 is driven on the falling edge (↓) of the clock signal (CLK) 1504. In one or more embodiments, a tri-state buffer is used to drive the DATA line between a microphone and an Application Processor. In one or more embodiments, the DATA line 1502 is pulled up with a resistor such as a 100 kilo-ohm resistor. Note that use of a tri-state buffer, clock signal rise or fall characteristic, and 100 kilo-ohm pull-up resistor are given only for illustration of an example and do not limit embodiments of the invention.

A programming device, such as an Application Processor, transmits a sequence of data a shown in FIG. 15 to accomplish programming a fractional delay into a microphone. The sequence begins with a magic word (unique word) indicated at 1506. The magic word is followed by a microphone address 1508. In the example provided at 1502 the magic word 1506 and the microphone address 1508 are two bytes long. In this example, four bits are allocated for microphone addresses. Thus, with four bits, 16 unique microphones can be addressed. As described above, a longer microphone address will accommodate a number of microphones greater than 16. Thus, embodiments can be configured to accommodate as many microphones as are required in a given application.

Delay information is indicated at 1510 with DELAY0 and DELAY1 indicating nominally two bytes. An amount of delay information 1510 can be flexibly configured according to a system design to submit either the time delay value or meta data corresponding to the time delay value for programming. As described above, if a fractional delay block is configured to apply a fractional delay in the range of 1 to 512 element delays, the delay information 1510 takes on values ranging from 1 to 512. In such an example, 5 bits would be the minimum number of bits needed to accommodate values within the range 1 to 512. Other information can be part of the delay information 1510 such as paired inverter group number, etc. Finally, acknowledge information (ACK) concludes the sequence shown at 1502. ACK 1502 can be a bit, one or more bits, or one or more bytes. In an implementation where ACK is a bit, upon successful recognition of the magic word 1506 and microphone address 1508, a receiving microphone transmits a predetermined value for ACK back to the programming device (Application Processor) over the DATA line 1502 which is configured for bi-directional input output. In one or more embodiments, the microphone transmits a value ACK=1 after successfully reading the magic word 1506 and microphone address 1508.

In various embodiments, the components of systems as well as the systems described in the previous figures are implemented in an integrated circuit device, which may include an integrated circuit package containing the integrated circuit. In some embodiments, the components of systems as well as the systems are implemented in a single integrated circuit die. In other embodiments, the components of systems as well as the systems are implemented in more than one integrated circuit die of an integrated circuit device which may include a multi-chip package containing the integrated circuit.

Figure 16:
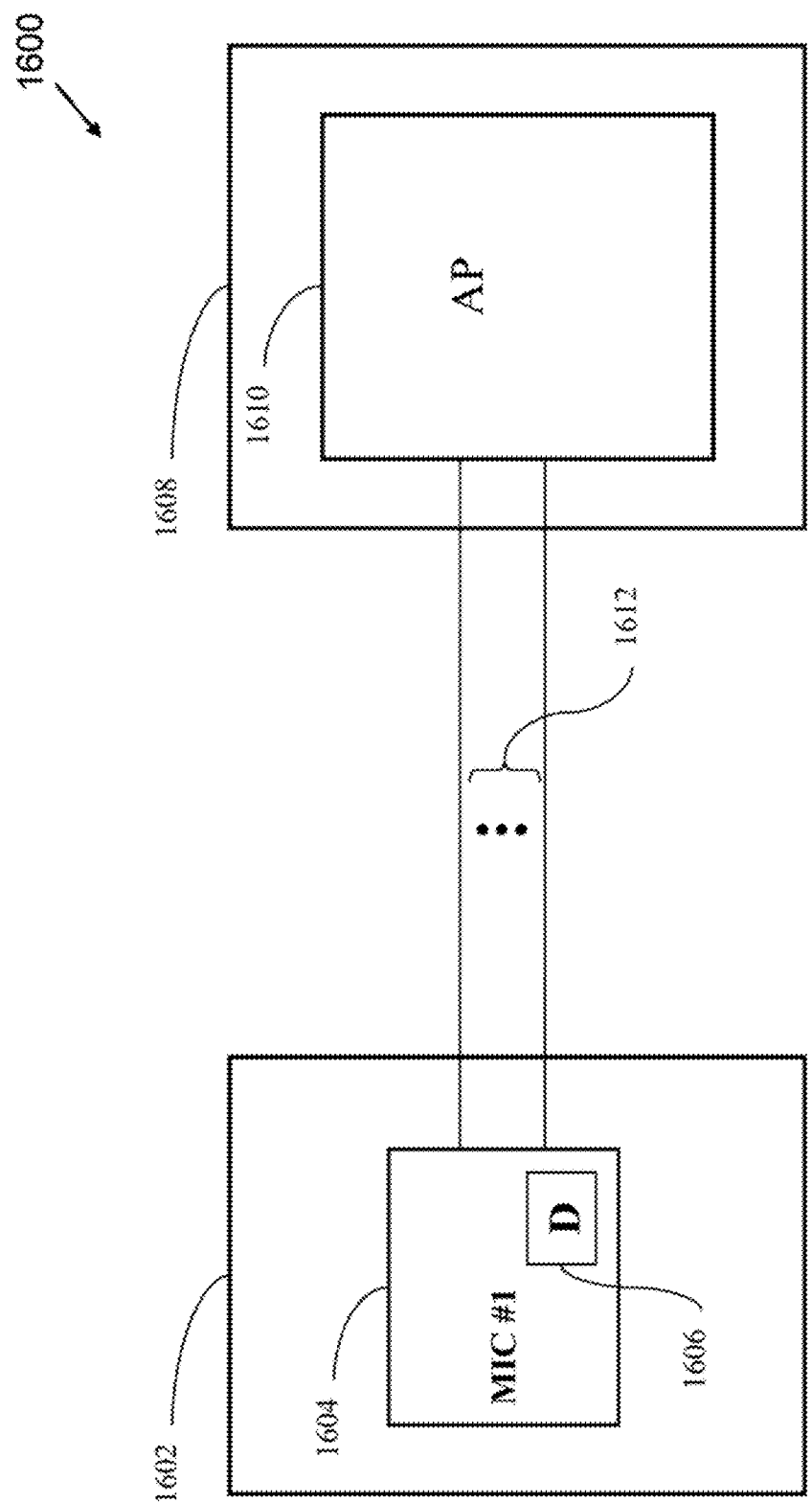
FIG. 16 illustrates the fractional time delay block located with the microphone, according to embodiments of the invention.

In various non-limiting embodiments, FIG. 16 illustrates the fractional time delay block and control logic located with the microphone, according to embodiments of the invention. For example, in one non-limiting embodiment as illustrated by the example of FIG. 16, the components of the system are implemented in more than one integrated circuit die. With reference to 1600, a first integrated circuit die 1602 includes the digital sensor 1604 (e.g., microphone), as described above, fractional time delay block and control logic are indicated at 1606. The fractional time delay block and control logic at 1606 are configured for programming in order to impart a fractional time delay to the output of the digital sensor as described above in conjunction with the preceding figures.

A second integrated circuit die, indicated at 1608, includes an Application Processor 1610. Data and clock lines 1612 connect the microphone 1604 and the Application Processor 1610. The Application Processor 1610 includes a PDM receiver (not shown) which receives data from the microphone 1602 over the data line which is part of 1612.

Figure 17:
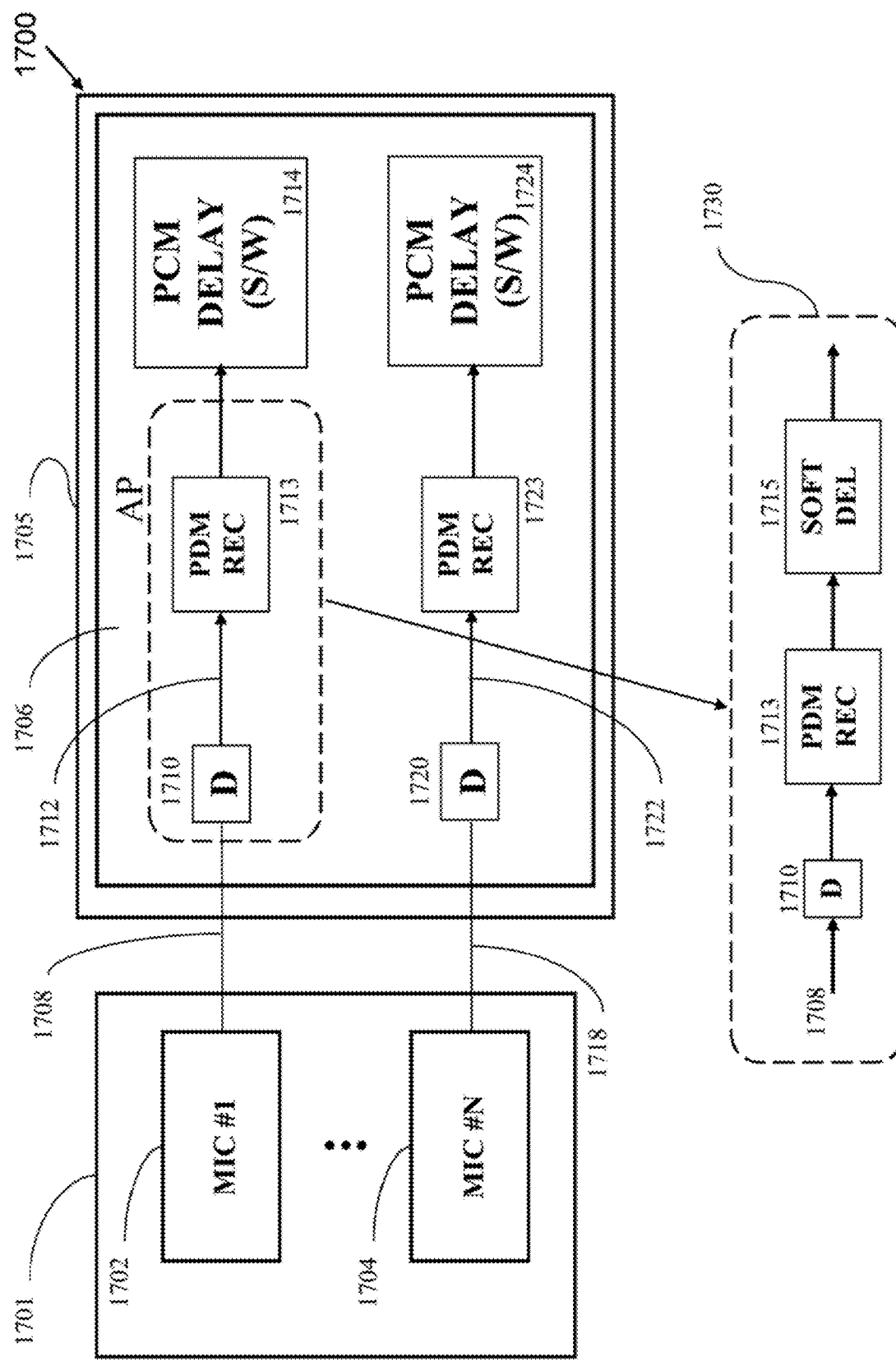
FIG. 17 illustrates the fractional time delay block located with the Application Processor, according to embodiments of the invention.

FIG. 17 illustrates, generally at 1700, components of a system that are implemented in more than one integrated circuit die but follow a different distribution from that shown in FIG. 16. FIG. 17 illustrates the fractional time delay block and control logic located with the Application Processor, according to embodiments of the invention. With reference to 1700, a first integrated circuit die 1701 includes a digital sensor 1702, which can be a digital microphone as described above. Optionally, there can be more than one digital sensor located on the first integrated circuit die 1701 as indicated by 1704.

A second integrated circuit die 1705 includes an Application Processor 1706. The Application Processor 1706 includes a PDM receiver module 1713. The microphone 1702 is connected to the Application Processor 1706 by data and clock lines indicated at 1708. Data from the microphone 1702 is input into a fractional delay block and control logic indicated at 1710. The fractional delay block and control logic 1710 is located with the Application Processor 1706 on the second integrated circuit die 1705. The PDM receiver module 1713 receives an output 1712 from the fractional time delay block control logic 1710. The fractional delay and control logic 1710 respond to programming information and imparts a time delay into the output 1712. In some embodiments, a portion of the fractional time delay is implemented in software at a block 1714. The software implementation at the block 1714 is part of the pulse code modulation (PCM) processing applied to the down sampled signal coming from the PDM receiver 1713. The time delay applied in software in the block 1714 imparts a delay of magnitude equivalent to one or more samples at the baseband clock rate.

Optionally, in some embodiments, there are additional data and clock lines 1718 and fractional delay block and control logic 1720 to accommodate optional microphones 1704 as needed. The fractional delay and control logic 1720 respond to programming information and imparts a time delay into the output(s) 1722. Similarly, in some embodiments, there are optional software implementations of a part of the fractional delay as indicated at 1724. The software implementation 1724 is part of the pulse code modulation (PCM) processing applied to the down sampled signal coming from the PDM receiver 1723. The time delay applied in software in the block 1724 imparts a delay of magnitude equivalent to one or more samples at the baseband clock rate.

Alternatively, a magnitude of a fractional time delay can be a sum of a fractional delay portion applied at 1710 (of magnitude equal to one or more clock cycles at the sampling clock rate as previously described with a circuit implemented in a Fractional Delay Block and a portion of the time delay is derived from a delay in software as indicated at 1730. With reference to 1730 an oversampled output 1708 is input into a fractional delay block 1710 and experiences a fractional delay as described above. An output from the fractional delay block 1710 is input into a PDM receiver 1713 where it is down sampled and then the signal is input into a software delay block 1715. In one or more embodiments, the software delay block 1715 is configured to receive the outputs from the PDM receiver 1713 into a circular buffer. In operation, data continuously proceeds through the circular buffer and the time delayed version of the data is tapped off at a location in the buffer that corresponds to the desired software delay. In such an embodiment, programming data includes the position in the circular buffer that corresponds to the desired portion of the time delay that will be provided by the software delay. A length of the circular buffer is configured based on a consideration of the application and beam forming requirements of a system. For example, in a non-limiting example, provided only for illustration, an air acoustic application a circular buffer of size sixteen (16) element provides a useful range of spatial resolution for some useful acoustic system bandwidths.

Distribution of any of the systems illustrated in the figures above (e.g., any one or more of FIG. 1 through FIG. 17) can be distributed between one or more integrated circuits dies. The examples of FIG. 16 and FIG. 17 are provided merely for illustration and do not limit embodiments of the invention. In some embodiments, the components of systems illustrated in the first integrated circuit die 1602 and the second integrated circuit die 1608 are implemented in a single integrated circuit die. Similarly, in some embodiments, the components of systems illustrated in the first integrated circuit die 1701 and the second integrated circuit die 1705 are implemented in a single integrated circuit die. In some embodiments, the entire system is implemented in a single integrated circuit die. With reference to FIG. 17, in some embodiments, the fractional delay block is located on the input of the AP in order to present the minimum impact to the AP design.

An advantage to embodiments of the invention is that introducing a fractional time delay as described herein avoids the distortion incurred when a time delay is imparted to a signal through the use of a FIR filter. Use of a FIR filter or any filter to impart a time delay can introduce amplitude or phase distortion or both especially near the Nyquist frequency. Thus, a time delayed distortionless signal is obtained through application of embodiments of the invention.

Figure 18:
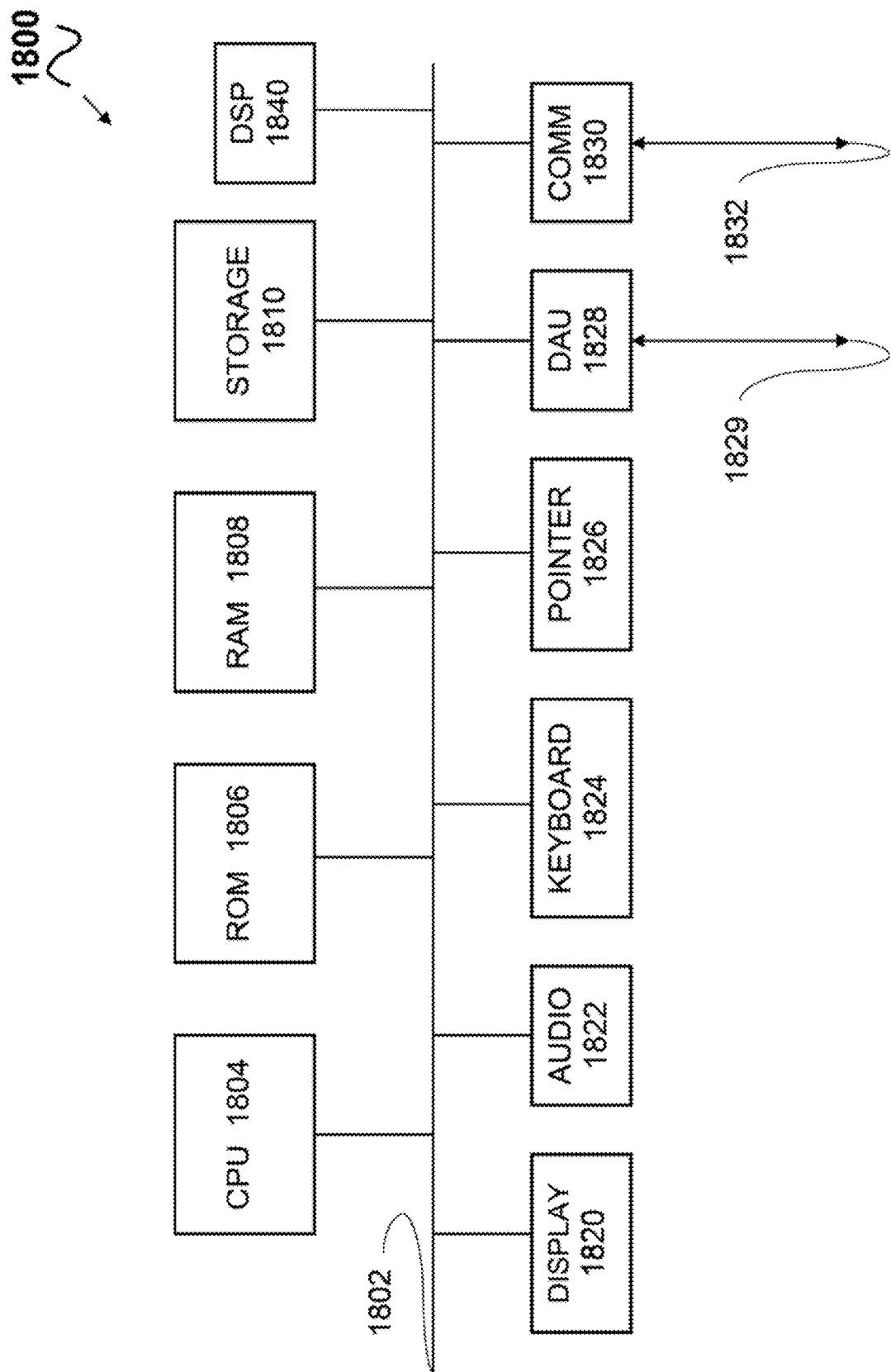
FIG. 18 illustrates a data processing system in which embodiments of the invention may be used.

FIG. 18 illustrates, generally at 1800, a data processing system in which embodiments of the invention may be used. The block diagram is a high-level conceptual representation and may be implemented in a variety of ways and by various architectures. With reference to FIG. 18, bus system 1802 interconnects a Central Processing Unit (CPU) 1804, Read Only Memory (ROM) 1806, Random Access Memory (RAM) 1808, storage 1810, display 1820, audio 1822, keyboard 1824, pointer 1826, data acquisition unit (DAU) 1828, and communications 1830. The bus system 1802 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), or a dedicated bus designed for a custom application, etc. The CPU 1804 may be a single, multiple, or even a distributed computing resource or a digital signal processing (DSP) chip. Storage 1810 may be Compact Disc (CD), Digital Versatile Disk (DVD), hard disks (HD), optical disks, tape, flash, memory sticks, video recorders, etc. The signal processing system 1800 can be an acoustic signal processing system used to receive acoustic signals that are input from a single microphone or a plurality of microphones (e.g., a first microphone, a second microphone, etc.). Note that depending upon the actual implementation of the acoustic signal processing system, the acoustic signal processing system may include some, all, more, or a rearrangement of components in the block diagram. In some embodiments, aspects of the system 1800 are performed in software. While in some embodiments, aspects of the system 1800 are performed in dedicated hardware such as a digital signal processing (DSP) chip 1840, or a system on a chip (SOC) which can also be represented at 1840, etc. as well as combinations of dedicated hardware and software as is known and appreciated by those of ordinary skill in the art.

Thus, in various embodiments, acoustic signal data is received at 1829 for processing by the acoustic signal processing system 1800. Such data can be transmitted at 1832 via communications interface 1830 for further processing in a remote location. Connection with a network, such as an intranet or the Internet is obtained via 1832, as is recognized by those of skill in the art, which enables the acoustic signal processing system 1800 to communicate with other data processing devices or systems in remote locations.

For example, embodiments of the invention can be implemented on a computer system 1800 configured as a desktop computer or work station, on for example a WINDOWS® compatible computer running operating systems such as WINDOWS® XP Home or WINDOWS® XP Professional, WINDOWS® 10 Home or WINDOWS® 10 Professional, Linux, Unix, etc. as well as computers from APPLE COMPUTER, Inc. running operating systems such as OS X, etc. Alternatively, or in conjunction with such an implementation, embodiments of the invention can be configured with devices such as speakers, earphones, video monitors, etc. configured for use with a Bluetooth communication channel. In yet other implementations, embodiments of the invention are configured to be implemented by mobile devices such as a smart phone, a tablet computer, a wearable device, such as eye glasses, a near-to-eye (NTE) headset, wrist band, watch, handheld device or the like.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, waveforms, data, time series or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk read-only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, network PCs, minicomputers, mainframe computers, and the like. The invention can also be practiced in distributed computing environments where tasks are performed by remote processing devices that are linked through a communications network. In other examples, embodiments of the invention as described in the figures above can be implemented using a system on a chip (SOC), a Bluetooth chip, a digital signal processing (DSP) chip, a codec with integrated circuits (ICs) or in other implementations of hardware and software.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, mathematical expression, flow diagram or flow chart. Thus, one of ordinary skill in the art would recognize a block denoting A+B=C as an additive function whose implementation in hardware and/or software would take two inputs (A and B) and produce a summation output (C), Thus, the use of formula, algorithm, or mathematical expression as descriptions is to be understood as having a physical embodiment in at least hardware and/or software (such as a computer system in which the techniques of the present invention may be practiced as well as implemented as an embodiment).

Non-transitory machine-readable media is understood to include any mechanism for storing information in a form readable by a machine (e.g., a computer). For example, a machine-readable medium, synonymously referred to as a computer-readable medium, includes read only memory (ROM); random access memory (RAM); magnetic disk storage media; optical storage media; flash memory devices; except electrical, optical, acoustical or other forms of transmitting information via propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Thus, embodiments of the invention can be used in various acoustic systems. Some non-limiting examples of such systems are, but are not limited to, use in short boom headsets, such as an audio headset for telephony suitable for enterprise call centers, industrial and general mobile usage, an in-line "ear buds" headset with an input line (wire, cable, or other connector), mounted on or within the frame of eyeglasses, a near-to-eye (NTE) headset display or headset computing device, a long boom headset for very noisy environments such as industrial, military, and aviation applications as well as a gooseneck desktop-style microphone which can be used to provide theater or symphony-hall type quality acoustics without the structural costs, wrist wearable devices, and handheld devices.

While the invention has been described in terms of several embodiments, those of skill in the art will recognize that the invention is not limited to the embodiments described, but can be practiced with modification and alteration within the spirit and scope of the appended claims. The description is thus to be regarded as illustrative instead of limiting.

What is claimed is:

1. A method to program time delay data in an oversampled sensor, comprising:
   determining whether to enter Programming Mode based on a value of a system parameter received by the oversampled sensor, the oversampled sensor is sampled at an oversample frequency;
   entering Programming Mode when the value of the system parameter corresponds to Programming Mode, wherein the time delay data is programmed in the oversampled sensor during Programming Mode, the oversampled sensor uses the time delay data to time delay its output in an oversampled domain, a magnitude of a time delay applied in the oversampled domain is equal to an integer number of periods of the oversample frequency; and
   exiting Programming Mode after a predetermined time has expired relative to the entering.

2. The method of claim 1, wherein the system parameter is a frequency of a clock signal received by the oversampled sensor and the value of the system parameter that corresponds to Programming Mode occurs when the frequency of the clock signal is at an intermediate frequency.

3. The method of claim 2, further comprising:
   changing to Active Mode after the exiting if the frequency of the clock signal is at the oversample frequency.

4. The method of claim 3, further comprising:
   changing to one of the following states:
   1. Active Mode if the frequency of the clock signal is at the oversample frequency;

2. Sleep Mode if the frequency of the clock signal is at a low threshold in frequency;
3. Power Down mode if power is off;
4. Programming Mode if the frequency of the clock signal is at the intermediate frequency.

5. The method of claim 2, wherein Programming Mode is entered from a state selected from the group consisting of Sleep Mode, Active Mode and Power Down Mode.

6. The method of claim 1, wherein the time delay data includes a microphone address and data related to the magnitude of the time delay.

7. The method of claim 1, wherein the magnitude of the time delay is a sum of an integer number of periods of the oversample frequency and a time delay that is based on a clock period that is greater than a period of the oversample frequency.

8. An apparatus to program time delay data into an oversampled sensor, comprising:
   a digital sensor, the digital sensor is configured to receive a clock signal and to output an oversampled digital signal at an oversample frequency, the oversample frequency having an oversample period;
   time delay programming data, the oversampled sensor is configured to receive, from an external source, the time delay programming data; and
   a time delay block, the time delay block is configured to apply the time delay programming data in an oversampled domain at the oversample frequency, wherein an output from the time delay block is time delayed using the time delay programming data, a magnitude of a time delay associated with the output of the time delay block is equal to an integer number of oversample periods.

9. The apparatus of claim 8, wherein a data line is transitioned to input mode by control logic in response to a value of a system parameter.

10. The apparatus of claim 9, the value of the system parameter is a frequency of the clock signal received by the oversampled sensor, wherein logic transitions the a data line to input mode when a frequency of the clock signal is at an intermediate frequency.

11. The apparatus of calim 10, wherein the time delay programming data includes a sensor address and data related to the time delay.

12. The apparatus of claim 11, wherein the digital sensor is a digital microphone and a state of an L/R pin on the digital microphone is used as part of a digital microphone address.

13. The apparatus of claim 12, where the digital microphone contains an additional address pin and a state of the additional address pin is used as part of the digital microphone address.

14. The apparatus of claim 11, the digital microphone is implemented as a micro-electro-mechanical system (MEMS) sensor and it is a part of an integrated circuit.

15. The apparatus of claim 12, wherein the digital microphone produces a pulse density modulted (PDM) output signal.

16. The apparatus of claim 11, wherein an additional data line is coupled to the oversampled sensor and the additional data line is used to facilltitate addressing up to two additional oversampled sensors from an external source.

17. The apparatus of claim 16, wherein the exteral source is an Application Processor in a digital microphone system.

18. The apparatus of claim 8, wherein the output from the time delay block is time delayed by a fractional time delay.

19. A method to program time delay data in an oversampled sensor:
   entering Programing Mode by adjusting a system parameter;
   transmitting time delay data to the oversampled sensor while in Programing Mode;
   receiving a clock signal, wherein the clock signal is configured to be set to one of two different frequencies externally from the oversampled sensor;
   creating a magnitude of a time delay using the time delay data and an oversample period, wherein the magnitude of the time delay is equal to an integer number of oversample periods; and
   waiting a predetermined time for the transmitting to conclude.

20. The method of claim 19, wherein the system parameter is a frequency of the clock signal received by the oversampled sensor.

21. The method of claim 20, further comprising:
   changing a frequency of the clock signal supplied to the oversampled sensor to an intermediate frequency to enter Programming Mode.

22. The method of claim 21, wherein Programming Mode is entered from a state selected from the group consisting of Sleep Mode, Active Mode and Power Down Mode.

23. The method of claim 19, wherein a time delay applied to oversampled data is a fractional time delay.

24. An apparatus to program time delay data in an oversampled sensor, comprising:
   a processor module, the processor module is configured to communicate with the oversampled sensor using a clock line and a data line; and
   time delay programming data, the processor module is configured to send the time delay programming data to the oversampled sensor, during Programming Mode, over the data line when a frequency of a signal on the clock line is not equal to an oversample frequency; and
   the processor module is configured to receive oversampled data, output from the oversampled sensor, during Active Mode, the processor module changes a system parameter to switch between Programming Mode and Active Mode.

25. The apparatus of claim 24, wherein the data line is transitioned to output mode by control logic in response to a value of a system parameter.

26. The apparatus of claim 25, the value of the system parameter is a frequency of a clock signal output to the oversampled sensor, wherein the control logic transitions the data line to output mode when the frequency of the clock signal is at an intermediate frequency.

27. The apparatus of claim 26, wherein the time delay programming data includes a sensor address and data related to a time delay.

28. The apparatus of claim 26, wherein data received at the processor module is time delayed by a fractional time delay at the overesampled sensor.

29. The apparatus of claim 28, wherein a total time delay applied at the oversampled sensor includes the fractional time delay and a time delay that is based on a clock period that is greater than the sampling clock period.

30. The apparatus of claim 24, wherein the processor module includes a pulse density modultation (PDM) receiver and the oversampled sensor is a digital microphone outputing a PDM oversampled signal.

31. A non-transitory computer-readable medium storing program code for causing a data processing system to perform the steps comprising:

entering Programing Mode by adjusting a system parameter;
transmitting time delay data to an oversampled sensor while in Programming Mode;
receiving a clock signal, wherein the clock signal is configured to be set to one of two different frequencies externally from the oversampled sensor;
creating a magnitude of a time delay using the time delay data and an oversample period, wherein the magnitude of the time delay is equal to an integer number of oversample periods; and
waiting a predetermined time for the transmitting to conclude.

\* \* \* \* \*